(12) United States Patent
Fick et al.

(10) Patent No.: US 8,381,155 B1
(45) Date of Patent: Feb. 19, 2013

(54) VERTICAL INTERCONNECT PATTERNS IN MULTI-LAYER INTEGRATED CIRCUITS

(75) Inventors: David A. Fick, Ann Arbor, MI (US); Ronald G. Dreslinski, Sterling Heights, MI (US); Trevor N. Mudge, Ann Arbor, MI (US); David T. Blaauw, Ann Arbor, MI (US); Dennis M. Sylvester, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/200,831

(22) Filed: Oct. 3, 2011

(51) Int. Cl.
*G06F 17/50* (2006.01)

(52) U.S. Cl. ........................................................ 716/110

(58) Field of Classification Search .................... 716/110
See application file for complete search history.

(56) References Cited

U.S. PATENT DOCUMENTS

2009/0194768 A1* 8/2009 Leedy .............................. 257/48

* cited by examiner

*Primary Examiner* — Suchin Parihar

(74) *Attorney, Agent, or Firm* — Nixon & Vanderhye P.C.

(57) ABSTRACT

A method of generating valid vertical interconnect positions for a multiple layer integrated circuit including multiple layers stacked vertically above one another and having a bonding interface between at least one pair of layers. The interface is formed by the coupling of a pair of conductive bond patterns formed on facing surfaces of the pair of layers. The method includes defining a candidate transformation origin, defining a sub-region which tessellates across the patterns, applying a predetermined transformation to the patterns at the bonding interface, determining the validity of the candidate transformation origin in dependence on coincidence of at least a subset of the patterns with the transformed patterns, selecting a valid transformation origin, and defining a set of valid vertical interconnect positions associated with the valid transformation origin at positions in the bonding interface where the original and transformed patterns coincided with each other.

26 Claims, 22 Drawing Sheets

Combined Tile Square With Mirror Y (Origin A)

Combined Tile Square With Mirror X (Origin A)

Combined Tile Square With Mirror Y (Origin B)

Combined Tile Square With Mirror X (Origin B)

VERTICAL INTERCONNECT PATTERNS IN MULTI-LAYER INTEGRATED CIRCUITS

BACKGROUND OF THE INVENTION

1. Field of the Invention

The present invention relates to multi-layer integrated circuits (3D integrated circuits) and in particular to the positions at which vertical interconnects may be positioned to provide connections between different layers.

2. Description of the Prior Art

Three-dimensional integrated circuits in which two or more layers of active electronic components are integrated both vertically and horizontally into a single extended circuit have recently been developed. Stacking two-dimensional dies and connecting them in the third dimension reduces the footprint of the integrated circuit and can allow the close integration of different circuit types, wherein the layers which form the stack can each be built with different processes. In addition, the vertical dimension increases the possibilities for providing connections between the components of the integrated circuit.

The layers of a three-dimensional integrated circuit may be built up in various ways, such as by manufacturing essentially two-dimensional electronic components on two or more semiconductor wafers which are then aligned and bonded together. This bonding may for example be carried out using by a pattern of copper bond points provided on a face of a semiconductor wafer, such that two wafers with this pattern can each be ground to a smooth surface (for example by chemical mechanical polishing (CMP)) and fused together.

One notable consequence in the present context of using such a technique for bonding layers of the three-dimensional integrated circuits together is that these copper bond points also define the positions at which a vertical interconnect, which couples components in one layer to components in the next, may validly be placed.

FIG. 1 schematically illustrates a side view of a wafer layer 10 having a front face 11 and a back face 12 each of which are partially formed by a set of copper bond points 13 and 14 respectively. It will be understood that viewed from above, these copper bond points form a pattern of shapes (for example, octagons) which extend across the wafer surfaces. The wafer 10 itself comprises a silicon oxide sub-layer 20 and a silicon crystal sub-layer 22. At the interface between the silicon oxide sub-layer 20 and the silicon sub-layer 22 are formed the transistors (transistor layer 24) which comprise the logical components of this layer of the integrated circuit. Within the silicon oxide sub-layer 20 are stacked metal layers 26 which provide the interconnections between the logical components of this portion of the integrated circuit. Also shown in FIG. 1 is a through-silicon-via (TSV) connecting one of the metal layers 26 in silicon oxide sub-layer 20 to one of the copper bond points 14 at the back face 12 of the layer. Accordingly, it will be understood that in setting out the layout of an integrated circuit within a layer such as that illustrated in FIG. 1, the system designer is constrained to place any TSVs such that they align with the positions of the copper bond points 14 on the back face 12 to which the TSV connects.

This type of constraint applies at each layer of a multi-layer three-dimensional integrated circuit, in that the system designer is constrained to place "vertical interconnects" (which may be TSVs on a back face connection, normal vias on a front face connection and so on) within each layer at positions which are allowed by the copper bond points present at the surface to which the respective vertical interconnect connects. Where a vertical interconnect may be placed within an integrated circuit in each layer thus depends upon the relative positioning of the components of that integrated circuit with respect to the copper bond points for that layer. This can result in a lengthy and laborious design process wherein the system designer must ensure that the positions of the vertical interconnects throughout each layer of the three dimensional integrated circuit are correctly positioned with respect the relevant copper bond points.

Accordingly it would be desirable to provide an improved technique for designing a multiple layer integrated circuit wherein this design compliance burden for the system designer is reduced.

SUMMARY OF THE INVENTION

Viewed from a first aspect the present invention provides a method of generating a set of valid vertical interconnect positions for a multiple layer integrated circuit, wherein said multiple layer integrated circuit comprises:

multiple layers stacked vertically above one another;

a bonding interface between a pair of layers in said multiple layers, wherein said bonding interface is formed by coupling of a pair of conductive bond patterns formed on facing surfaces of said pair of layers, each pattern of said pair of conductive bond patterns comprising an arrangement of conductive bonding elements, said method comprising the steps of:

defining a candidate transformation origin within a horizontal plane defined by said bonding interface;

defining a sub-region within said arrangement of conductive bonding elements, wherein said sub-region tessellates across said arrangement of conductive bonding elements;

applying a predetermined transformation in said horizontal plane with respect to said candidate transformation origin to said arrangement of conductive bonding elements within said sub-region to generate a transformed arrangement of conductive bonding elements;

determining validity of said candidate transformation origin in dependence on coincidence of at least a subset of said arrangement of conductive bonding elements with said transformed arrangement of conductive bonding elements;

selecting a valid transformation origin in dependence on an outcome of said step of determining validity of said candidate transformation origin; defining a set of valid vertical interconnect positions associated with said valid transformation origin where said arrangement of conductive bonding elements coincides with said transformed arrangement of conductive bonding elements; and outputting said set of valid vertical interconnect positions.

Viewed from a second aspect, the present invention provides a method of generating an arrangement of a multiple layer integrated circuit, comprising the method as set out in the first aspect and further comprising the steps of:

arranging a first logical module within said multiple layer integrated circuit, said first logical module vertically spanning said pair of layers, and said first logical module comprising a plurality of vertical interconnects at positions permitted by said set of valid vertical interconnect positions;

generating a second logical module within said multiple layer integrated circuit, a layout of said second logical module being a result of applying said predetermined transformation to said first logical module with respect to said valid transformation origin, and placing said result at a horizontal offset with respect to said first logical module, wherein applying said horizontal offset to said valid transformation origin results in an offset valid transformation origin at a same relative position with respect to said tessellating sub-region; and outputting said arrangement of said multiple layer integrated circuit.

The inventors of the techniques presented herein realised that the task of designing and creating a multiple layer integrated circuit could be facilitated by generating the arrangement of the multiple layer integrated circuit using modules, wherein a module has both horizontal and vertical extent within the multiple layer integrated circuit, in particular spanning a bonding interface between a pair of layers within the multiple layer integrated circuit. According to this second aspect of the present techniques, a first logical module is arranged within the multiple layer integrated circuit and is then copied to form a second logical module at a horizontally offset position with respect to the first logical module.

This technique is enabled by a process, forming the first aspect of the present techniques, of examining the arrangement of conductive bonding elements at a bonding interface within the multiple layer integrated circuit and applying a predetermined transformation in the horizontal plane to the arrangement of conductive bonding elements present at that interface (i.e. applying the predetermined transformation to the pattern formed by the conductive bonding elements at that interface). The predetermined transformation is performed, with respect to a candidate transformation origin, to the arrangement of conductive bonding elements present at that interface within a defined sub-region, wherein the sub-region tessellates across the whole arrangement of conductive bonding elements. In other words, the sub-region defines a "sub-pattern" or "tile" within the pattern formed by the conductive bonding elements which repeats across that pattern. It should be noted that the ordering of the steps of defining the candidate transformation origin and defining the sub-region may be freely selected. In other words, the sub-region could be defined first and then the origin, or vice versa. Indeed the two can also effectively be selected together if for example the origin is defined to lie at a particular point with respect to the sub-region (e.g. at one corner).

The validity of that candidate transformation origin is then determined in dependence on the coincidence of the arrangement of conductive bonding elements before and after the predetermined transformation is applied. In other words, if a sufficient number of conductive bonding elements in the transformed pattern align with conductive bonding elements in the original pattern, then the candidate transformation origin is determined to be valid. It should be understood that, depending on the particular choice of origin with respect to the sub-region and the particular transformation under consideration, the coincidence of the original pattern and the transformed pattern may take place within the originally defined sub-region or may take place in, say, an adjacent sub-region. For example if a mirroring of the sub-region is performed with respect to an origin on the edge of the sub-region, the transformation result will in fact lie on the further sub-region which meets that edge. However, since by definition all sub-regions represent the same pattern, this is of no consequence for determining the validity of the candidate transformation origin.

Once a valid transformation origin has been selected, a set of valid vertical interconnect positions associated with that valid transformation origin can be defined for the bonding interface, this being the positions where the original pattern of conductive bonding elements and the transformed pattern of conducting bonding elements coincide with one another. This set of valid vertical interconnect positions can then be output in order to form the basis of the following design process.

Following the initial procedure of generating the set of valid vertical interconnect positions, a subsequent procedure can be carried out in which a first logical module can be arranged within the multiple layer integrated circuit wherein the vertical interconnects are set out at those positions in the interface determined to be valid vertical interconnect positions. Having set out the arrangement of a first logical module in this way, the system designer then knows that a second logical module, being a copy of the first logical module subjected to the predetermined transformation, will result in a configuration in which the vertical interconnects in the second logical module will be positioned at valid vertical interconnect positions, so long as the position at which the second logical module is placed results in the transformation origin associated with the second logical module being at the same relative position with respect to the tessellating sub-region. To take a simple example, if the selected valid transformation origin lies at one corner of the tessellating sub-region then the horizontal offset of the second logical module must position the offset origin at the same corner of the tessellating sub-region (under the understanding that the original and offset origins are of course considered with respect to different instances of the sub-region).

The logical modules could take a variety of forms, but may for example at the simpler end of the spectrum be one or more logic gates formed in each of the pair of layers of the multiple layer integrated circuit. In more complex examples the logical modules could be a processor core, an associated cache and so on. Accordingly, whatever particular form this module takes, it can be instantiated many times in the multiple layer integrated circuit without the system designer having to reconsider where the vertical interconnects may legally be placed with respect to the bonding interface of the multiple layer integrated circuit.

In one embodiment said multiple layer integrated circuit comprises a second bonding interface between a second pair of layers in said multiple layers, and said second bonding interface is formed by the coupling of a second pair of conductive bond patterns formed on facing surfaces of said second pair of layers, each pattern of said second pair of conductive bond patterns comprising a second arrangement of conductive bonding elements, and the method of generating the set of valid vertical interconnect positions comprises:

defining said sub-region within a combined pattern formed by overlaying said arrangement of conductive bonding elements on said second arrangement of conductive bonding elements, wherein said sub-region tessellates across said combined pattern;

applying said predetermined transformation in said horizontal plane with respect to said candidate transformation origin to said second arrangement of conductive bonding elements within said sub-region to generate a transformed second arrangement of conductive bonding elements, wherein said step of determining said validity of said candidate transformation origin is performed in further dependence on coincidence of at least a subset of said second arrangement of conductive bonding elements with said transformed second arrangement of conductive bonding elements; and defining a second set of valid vertical interconnect positions associated with said valid transformation origin where said second arrangement of conductive bonding elements coincides with said transformed second arrangement of conductive bonding elements.

When generating an arrangement of the multiple layer integrated circuit on the basis of the set of valid vertical interconnect positions in this embodiment, the first module additionally vertically spans said second pair of layers and comprises' a second plurality of vertical interconnects at positions permitted by said second set of valid vertical interconnect positions.

Accordingly, there may be more than one bonding interface in the multiple layers. In particular, the one (or more) additional bonding interface may have a conductive bond element pattern which differs from that of the first bonding interface. The inventors of the present invention realised that additional bonding interfaces such as this could considerably complicate the process of designing a multiple layer integrated circuit, because if a logical module formed at a first position in the integrated circuit is desired to be copied to an offset position in the integrated circuit, the particular patterns of conductive bonding elements at each interface may mean that the copy of the logical module at the offset position does not align with legal vertical interconnect positions.

To address this, the technique presented includes defining the sub-region within a combined pattern that is formed by overlaying the arrangement of conductive bonding elements from each of the interfaces under consideration, wherein the sub-region tessellates across the combined pattern. Hence, a pattern that repeats when all interfaces under consideration are taken into account is identified, this enabling the copying and repositioning of a module which spans more than one interface. Accordingly the described procedure of applying a predetermined transformation, determining validity of a candidate transformation origin, selecting a valid transformation origin and defining sets of valid vertical interconnect positions may be performed with respect to however many bonding interfaces are under consideration.

It should be recognised that the technique of the present invention may be applied to a multiple layer integrated circuit in which it is intended that a logical module spans only a first and second bonding interface, but it is equally applicable to a multiple layer integrated circuit in which the modules may span three or more pairs of layers (and the bonding interfaces between them).

The predetermined transformation can take a number of forms. In one embodiment said predetermined transformation comprises a rotational transformation. In one embodiment said predetermined transformation comprises a reflectional (mirroring) transformation.

The determination of the validity of a candidate transformation origin may be performed with respect to more than one predetermined transformation and in such embodiments the method further comprises:

applying at least one further predetermined transformation in said horizontal plane with respect to said candidate transformation origin to said arrangement of conductive bonding elements to generate at least one further transformed arrangement of conductive bonding elements, wherein said step of determining validity of said candidate transformation origin is performed in further dependence on coincidence of at least a subset of said arrangement of conductive bonding elements with said at least one further transformed arrangement of conductive bonding elements.

Accordingly, in order for the candidate transformation origin to be determined as valid, the plural transformed patterns resulting from more than one transformation being applied (separately) to the original pattern have to coincide with one another. This then advantageously means that a module can be transformed by any of the transformations considered and any such transformation will result in a module which has valid vertical interconnects that align correctly with the conductive bonding elements. For example the predetermined transformations could comprise a 90 degree rotation, a 180 degree rotation, a 270 degree rotation and a mirroring transformation, together with the mirrored versions of each rotation. A valid transformation origin selected according to the above described process would then provide the basis for mapping a module transformed by any integer number of 90 degree rotations and/or by the mirror operation, giving the system designer great flexibility in how the original, rotated or flipped module may be placed at other positions in the integrated circuit.

In one embodiment coincidence of one of said arrangement of conductive bonding elements with one of said transformed arrangement of conductive bonding elements is determined to occur if an overlap area between said one of said arrangement of conductive bonding elements with said one of said transformed arrangement of conductive bonding elements allows a legal placement of a vertical interconnect with respect both to said arrangement of conductive bonding elements and to said transformed arrangement of conductive bonding elements.

Accordingly, if the overlap area between a conductive bonding element in the original pattern and a conductive bonding element in the transformed pattern is sufficiently large to allow a legal placement of a vertical interconnect with respect to either the original pattern or the transformed pattern then this location may be deemed to be a valid vertical interconnect position. What constitutes a "legal" placement may be defined by the system designer or may be imposed by manufacturing rules associated with the integrated circuit being generated.

In one embodiment, said sub-region is determined by a sub-region determination process comprising the steps of:

identifying a first pair of orthogonal regularity distances at which said arrangement of conductive bonding elements repeats, said first pair of orthogonal regularity distances being defined with respect to axes which are mutually orthogonal;

identifying a second pair of orthogonal regularity distances at which said second arrangement of conductive bonding elements repeats, said second orthogonal regularity distances being defined with respect to said axes; and determining an orthogonal pair of lowest common multiple distances from said first pair of orthogonal regularity distances and said second pair of orthogonal regularity distances, said orthogonal pair of lowest common multiple distances defining said sub-region.

Accordingly, the sub-region may be determined by identifying the regularity distance at which the first and second arrangements of conductive bonding elements repeat with respect to orthogonal axes and then determining the lowest common multiple for the distances defined with respect to each axis. Hence, a sub-region defining a sub-pattern which repeats within the combined pattern formed by the conductive bonding elements at each interface can be found.

The method may further comprise the steps of:

determining if said sub-region comprises at least one conductive bonding element which repeats at low frequency in said combined pattern; and eliminating said at least one conductive bonding element which repeats at low frequency from said sub-determination process.

In situations where the sub-region comprises at least one conductive bonding element which repeats at low frequency in the combined pattern (i.e. where the combined pattern contains other conductive bonding elements which repeat at higher frequency), then eliminating one or more low frequency repeating conducting bonding element from the sub-region can result in a smaller selected search region, since the lowest common multiple distances will correspondingly reduce. This can then allow the predetermined transformation to be applied with respect to a smaller area and in particular, because the size of the sub-region determines the steps at which the second module can be placed with respect to the first module, the range of positions at which the module can be placed increases.

In one embodiment said predetermined transformation comprises a rotational transformation and said orthogonal pair of lowest common multiple distances are both determined as a single lowest common multiple distance from said first pair of orthogonal regularity distances and said second pair of orthogonal regularity distances.

When the predetermined transformation comprises a rotational transformation, it is advantageous (though not essential) to determine the orthogonal pair of lowest common multiple distances as a single value, such that the sub-region is square-shaped and the rotation of that sub-region can map directly onto itself, simplifying the procedure of determining a valid transformation origin and associated predetermined transformation for a given interface or interfaces.

In one embodiment said step of defining a candidate transformation origin is performed as an iterative process, wherein a chosen location of said candidate transformation origin is incremented by a predetermined increment for each step of said iterative process. Accordingly the candidate transformation origins considered may be treated in turn by proceeding across said horizontal plane in steps given by said predetermined increment. Of course, the increments may be taken with respect to one or both the two orthogonal axes which define the horizontal plane. The predetermined increment may be defined in a number of ways, but in one embodiment is determined by a minimum manufacturing step size for said multiple layer integrated circuit.

The bonding interfaces may be formed in a number of ways, but in one embodiment said bonding interface is a copper bond interface and said conductive bonding elements are copper bond points. Alternatively the bonding interface may employ other technologies such as, for example, micro-c4 based processes.

When there is more than one bonding interface under consideration, these may be the same or may differ. For example, two interfaces may be replicas of one another or may correspond to entirely different processes. Accordingly in one embodiment said arrangement of conductive bonding elements and said second arrangement of conductive bonding elements are the same, whilst in other embodiments said arrangement of conductive bonding elements and said second arrangement of conductive bonding elements are different.

In one embodiment said arrangement of conductive bonding elements is predetermined in association with said predetermined transformation to enhance coincidence of said arrangement of conductive bonding elements with said transformed arrangement of conductive bonding elements. Accordingly, the pattern formed by the conductive bonding elements at the bonding interface may be selected to be particularly suitable for the predetermined transformation. For example the pattern of the conductive bonding elements may be defined such that it is not only very regular across the interface, but the shapes and spacing of the conductive elements may be chosen to overlap well with itself when subjected to the predetermined transformation. Similarly, in one embodiment said second arrangement of conductive bonding elements is predetermined in association with said predetermined transformation to enhance coincidence of said second arrangement of conductive bonding elements with said transformed second arrangement of conductive bonding elements.

Outputting the set of valid vertical interconnect positions for the multiple layer integrated circuit may take a number of forms. For example, the design process for the multiple layer integrated circuit may take place on one or more computing platforms and in such a scenario said outputting said set of valid vertical interconnect positions for said multiple layer integrated circuit comprises storing said set of valid vertical interconnect positions for said multiple layer integrated circuit in a non-transient fashion on a computer-readable storage medium. This computer-readable storage medium may then be used at a later date (possibly by a third party) to facilitate designing the arrangement of the multiple layer integrated circuit. Alternatively the process may be more direct and said outputting the set of valid vertical interconnect positions for said multiple layer integrated circuit may be immediately followed, as part of a single process, by manufacturing said multiple layer integrated circuit in accordance with said set.

Equally, outputting the arrangement of the multiple layer integrated circuit may take a number of forms. For example, the design process for the multiple layer integrated circuit may take place on one or more computing platforms and in such a scenario said outputting said arrangement of said multiple layer integrated circuit comprises storing said arrangement of said multiple layer integrated circuit in a non-transient fashion on a computer-readable storage medium. This computer-readable storage medium may then be used at a later date (possibly by a third party) to configure the manufacturing process of the multiple layer integrated circuit. Alternatively the process may be more direct and said outputting said arrangement of said multiple layer integrated circuit comprises manufacturing said multiple layer integrated circuit in accordance with said arrangement.

Viewed from a third aspect the present invention provides a computer-readable storage medium storing in a non-transient fashion said set of valid vertical interconnect positions for said multiple layer integrated circuit generated in accordance with the method of the first aspect.

Viewed from a fourth aspect the present invention provides a multiple layer integrated circuit having a set of valid vertical interconnect positions generated in accordance with the method of the first aspect.

Viewed from a fifth aspect the present invention provides a computer-readable storage medium storing in a non-transient fashion said arrangement of said multiple layer integrated circuit generated in accordance with the method of the second aspect.

Viewed from a sixth aspect the present invention provides a multiple layer integrated circuit having an arrangement generated in accordance with the method of the second aspect.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 2:
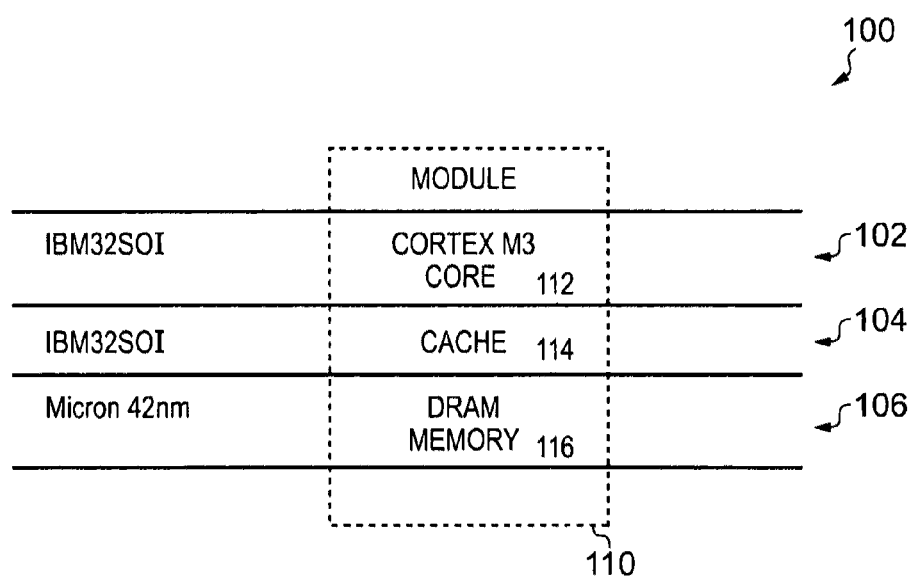
FIG. 2 schematically illustrates a module spanning three layers of a multiple layer integrated circuit in one embodiment.

FIG. 2 schematically illustrates a side view of a three layer integrated circuit 100. The 3D integrated circuit 100 comprises two upper layers 102, 104 which are both manufactured using the IBM32SOI process and a lower layer 106 which is manufactured using the Micron 42 nm process. Within the integrated circuit 100 is defined a module 110 which comprises a processor core 112 formed in the layer 102, a cache 114 formed in the layer 104 and DRAM memory 116 formed in the layer 106. In this example the processor core 112 is a Cortex-M3 as designed by ARM Limited, Cambridge, UK. Module 110 has been designed in accordance with the techniques of the present invention such that it may be readily replicated at further positions (as viewed from above) throughout the integrated circuit. These techniques will be described in more detail in the following.

Figure 1:
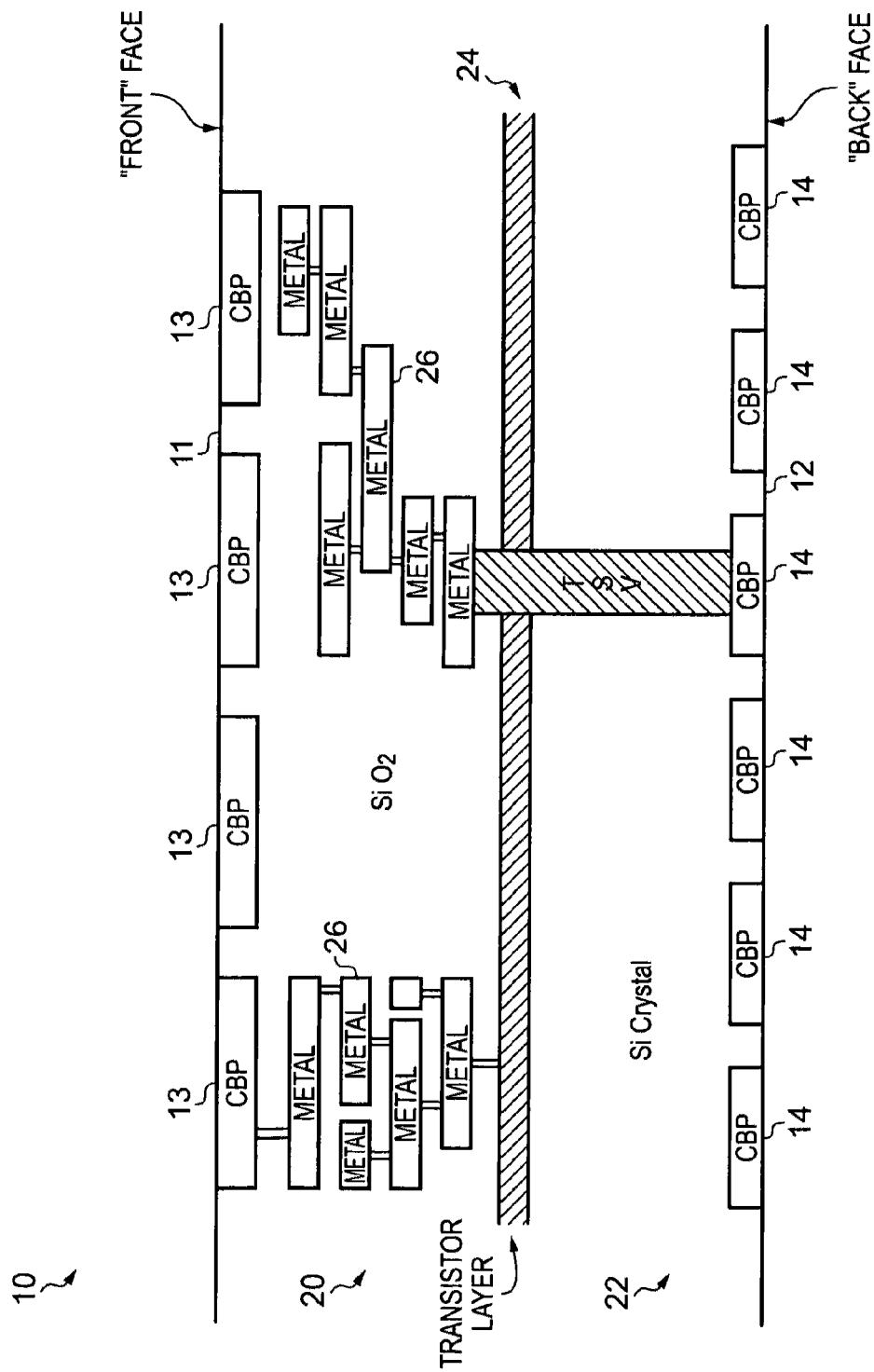
FIG. 1 illustrates a known single layer of an integrated circuit in which a vertical interconnect is placed to align with a copper bond point on the back face of that layer.
Figure 3:
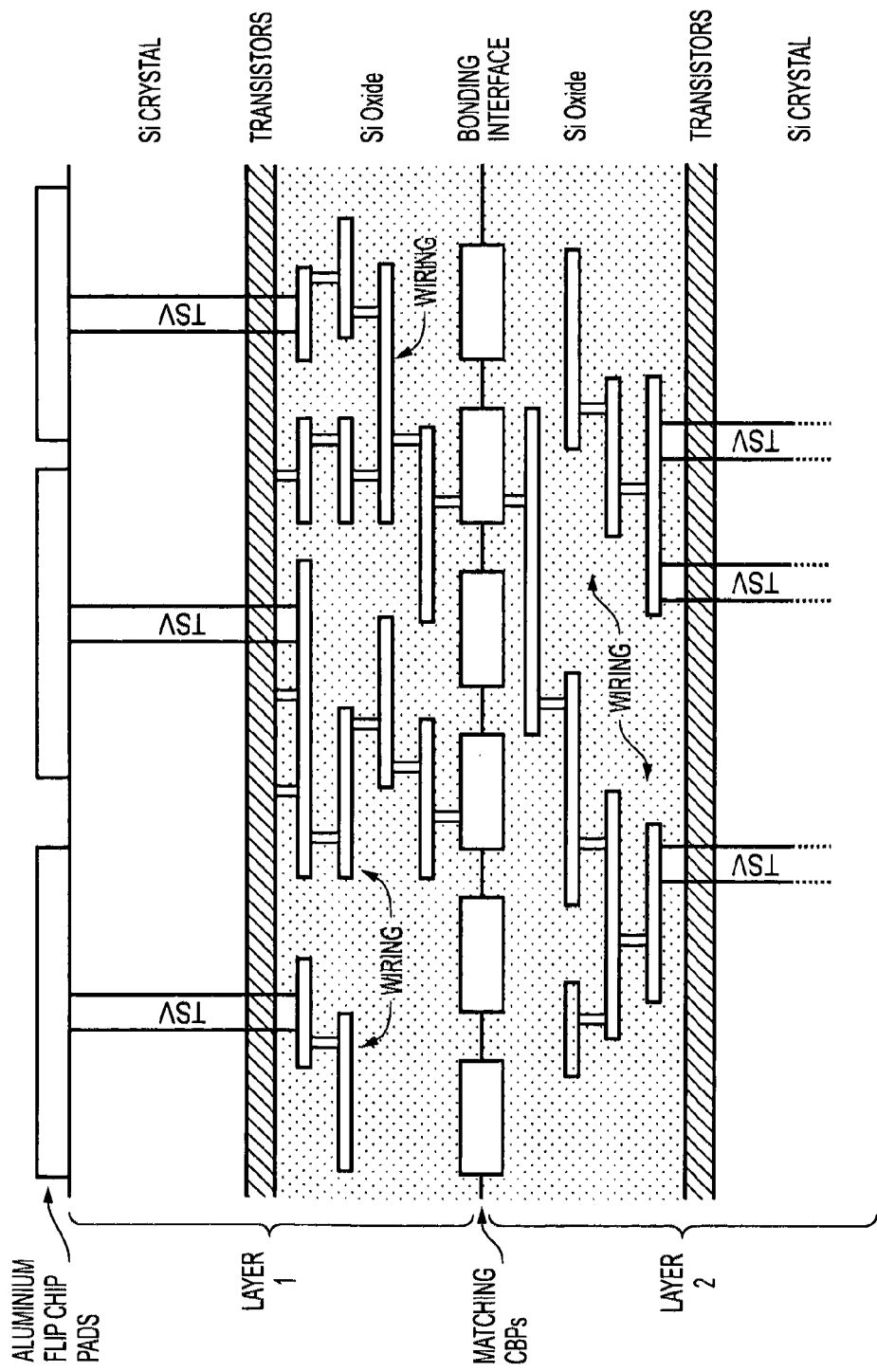
FIG. 3 schematically illustrates more detail of the elements of a multiple layer integrated circuit spanning four layers in one embodiment.
Figure 3:
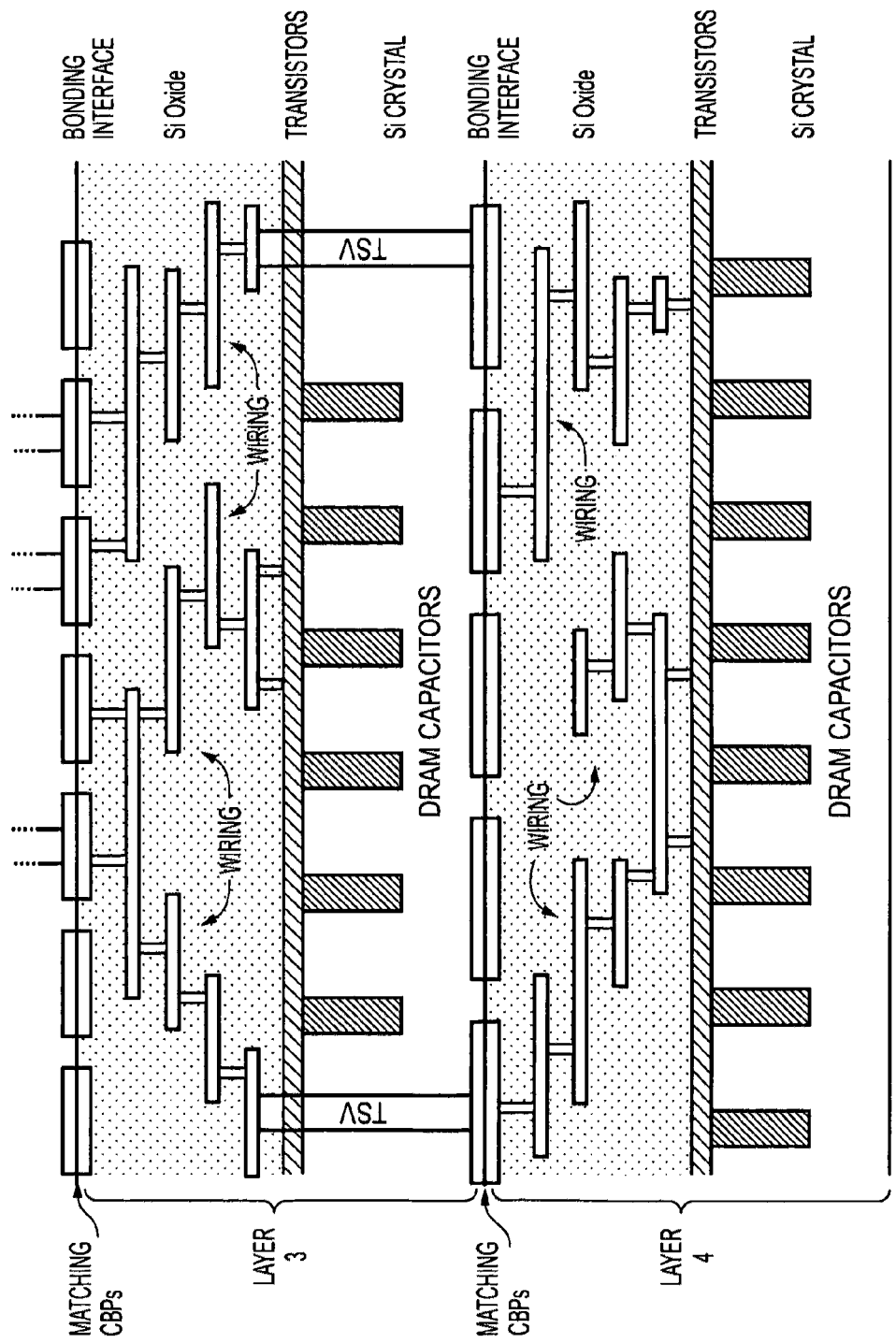

FIG. 3 schematically illustrates a more detailed side view of a multiple layer integrated circuit comprising four layers. It can be seen that where each layer meets an adjacent layer the bonding interface between the two is formed by a set of matching copper bond points (CBPs). As described above with respect to FIG. 1, each layer comprises a silicon crystal sub-layer and a silicon oxide sub-layer between which the transistors of the layer are sandwiched. Of particular note in the context of the present invention are the vertical interconnects labelled TSV (through-silicon-via) which pass through the silicon crystal sub-layers in layers 1, 2 and 3. These have been arranged by the system designer to couple to copper bond points at the interface between layers 2 and 3 and between layers 3 and 4, and to meet the aluminium flip chip pads at the upper face of layer 1.

From the complexity of only the relatively limited section of the multi-layer integrated circuit shown in FIG. 3 it will be appreciated that the placing of the vertical interconnects in the different layers of a multiple layer integrated circuit is a time consuming task for the system designer. The present invention addressed this problem by defining sub-sections of the 3D integrated circuit which can be repeated as modules, such as the module illustrated in FIG. 2. Then, the technique of the present invention comprises considering the different possible transformations which may wish to be applied to this module when copying it to another position within the integrated circuit. These techniques are described in more detail below. Note that the illustrated bonding interfaces in FIG. 3 could be replaced by, say, micro-c4 interfaces and this would not affect the general principle of the invention.

Figure 4:
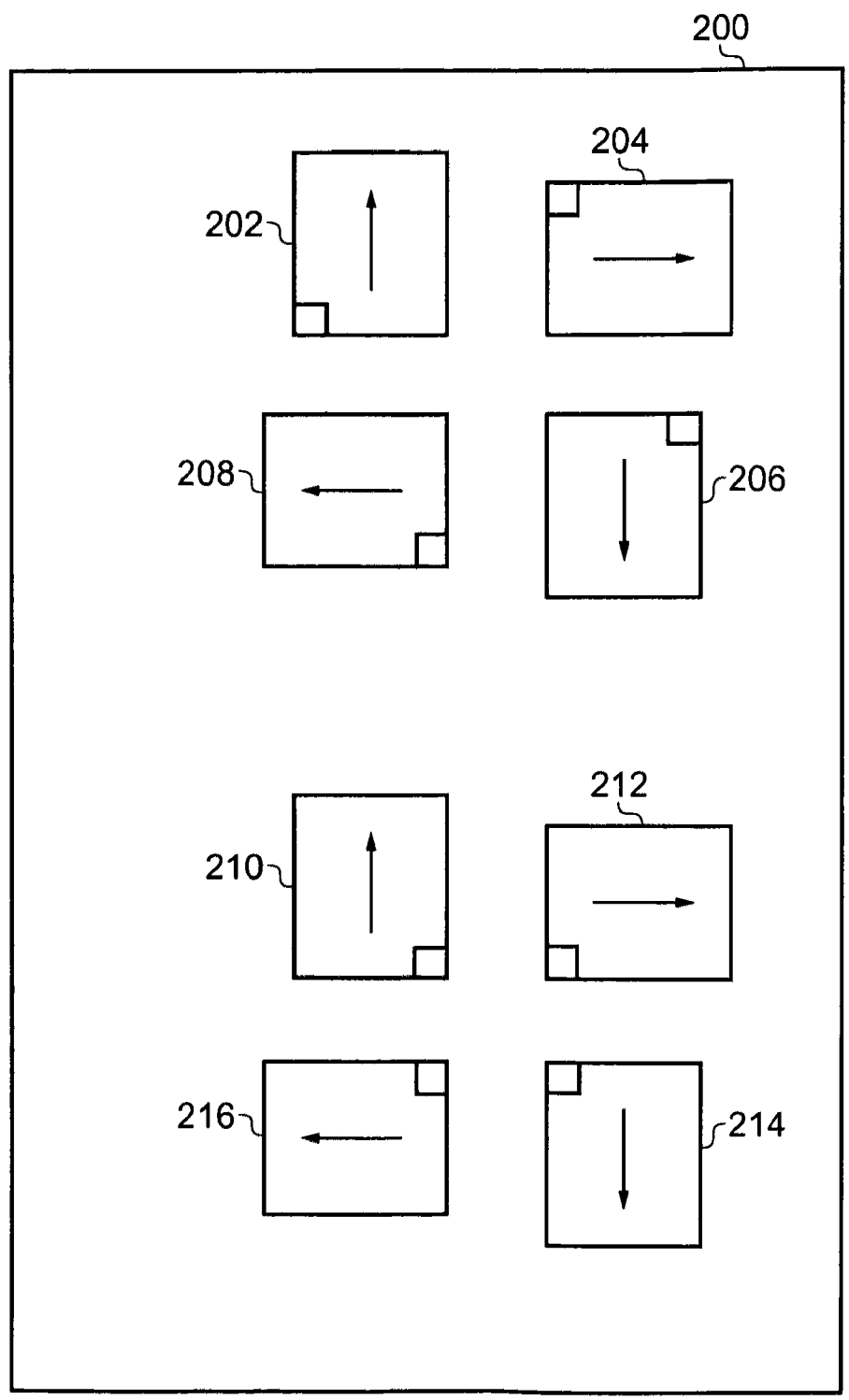
FIG. 4 illustrates a set of module orientations resulting from 90 degree rotation and mirroring transformations, with various horizontal offsets, in one embodiment.

FIG. 4 schematically illustrates a plan view (i.e. viewed perpendicular to the plane in which the layers lie) of a horizontal slice 200 of a 3D integrated circuit, showing a set of modules associated with a 90 degree rotation transformation and a mirroring transformation. Module 202 may be considered at the initial module to be instantiated. The copies of the module 202 shown by modules 204, 206 and 208 represent 90 degree transformations of the module 202. Similarly, module 210 represents a mirror transformation of module 202 and modules 212, 214 and 216 show the 90 degree transformation applied to this module. Accordingly, the modules 204, 206, 208, 210, 212, 214 and 216 represent the seven variants on the original module 202 which may be generated by: first applying a 90 degree rotation transformation (1 or more times) and/or a mirroring transformation; and secondly positioning the thus-transformed module at a horizontal offset with respect to the original module (where horizontal offset is understood here to be lateral movement within the plane 200). Constraint on the horizontal offsets that are possible will be discussed in more detail below.

For the system designer seeking to establish a 3D integrated circuit, it is clearly of great advantage if the design process associated with configuring a first module (say module 202) does not have to be entirely repeated when that module is reused elsewhere in the 3D integrated circuit (i.e. at a horizontal offset with respect to the position of the first module). As mentioned above, one particular aspect of the design process which would have to be repeated prior to the present invention is the placement of the vertical interconnects to align with the conductive bonding elements (e.g. copper bond points). However the techniques of the present invention not only mean that the module can be reused at a different position, but advantageously that the module can be transformed (by any number of 90 degree rotations and/or a mirroring in the example of FIG. 4) for that placement. This can facilitate the overall system design, not only by avoiding repetition of the vertical interconnect placement work, but also by allowing the system designer to rotate and flip the module as best fits the system requirements.

Figure 5:
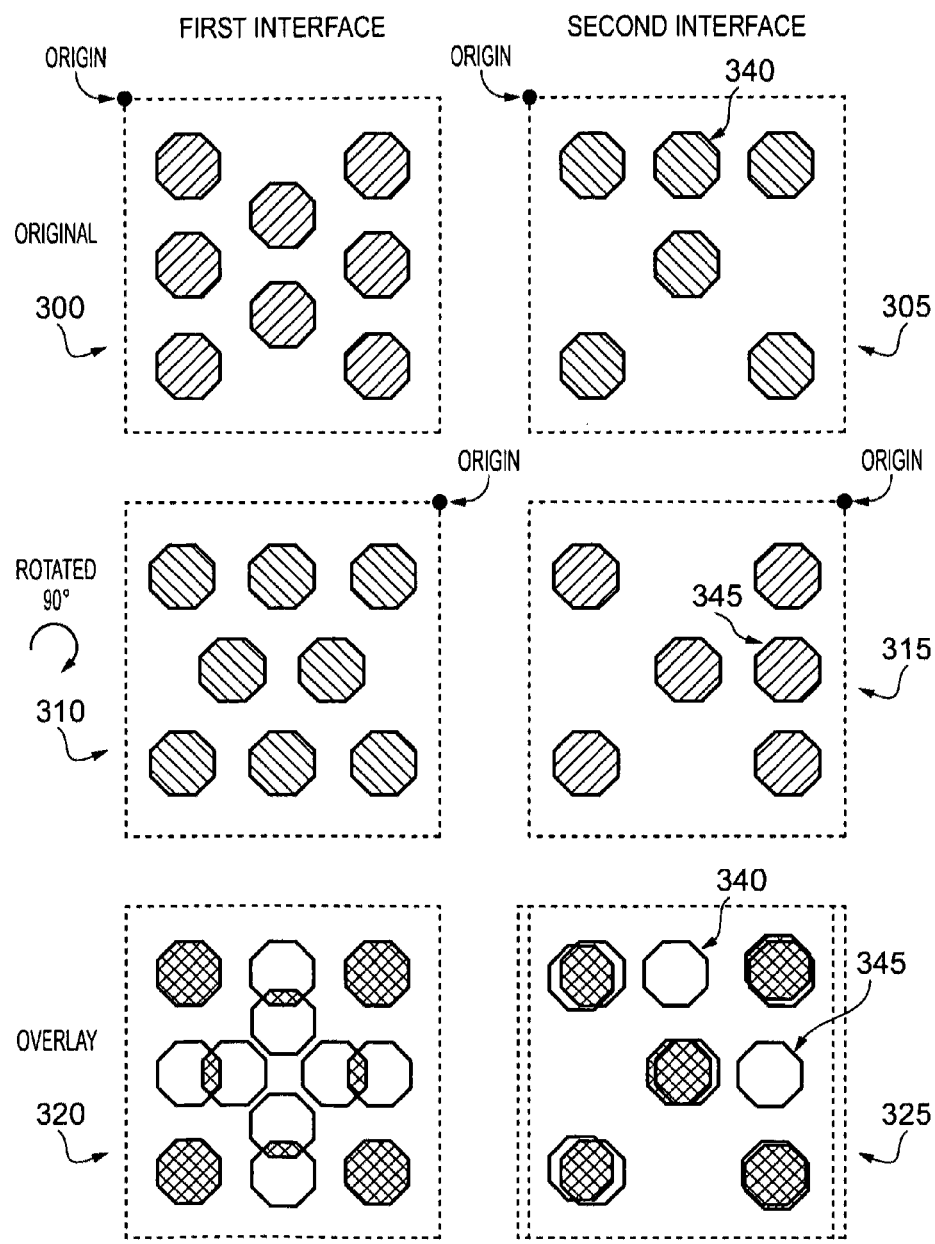
FIG. 5 schematically illustrates the determination of valid vertical interconnect positions in association with a rotation transformation in one embodiment.

FIG. 5 illustrates how the process of testing a candidate transformation origin is applied to a selected search region (also referred to as a "sub-region" herein) in one or two interfaces. The sub-regions shown by the dashed lines have been determined to represent "tiles" which tessellate across the full pattern of each interface. The left hand column shows that part of a first interface's conductive bond pattern which corresponds to the sub-region. The right hand column shows that part of a second interface's conductive bond pattern which corresponds to the sub-region. The first row shows the untransformed patterns. In other words the patterns 300 and 305 show the original first interface pattern and the original second interface pattern.

In this example a candidate transformation origin is being examined which is shown as being located at the top left-hand corner of the original patterns, although because of the tessellation of the tile (sub-region) it should be understood that each corner of the tile is equivalent with respect to the rotation. The predetermined transformation under consideration is a 90 degree clockwise rotation. The patterns 310 and 315 show the transformed first interface pattern and the transformed second interface pattern respectively. The final row then shows the original and transformed patterns overlaid. The cross-hatched marking indicates the regions where the conductive bond elements of the original and transformed patterns overlap with one another. Where this overlap is sufficiently large represents a valid vertical interconnect position. In the case of overlaid patterns 320 from the first interface, the four corner conductive bond elements align very well and thus represent valid vertical interconnect positions, but the partial overlaps closer to the centre of the region are not large enough for a vertical interconnect to be legally placed with respect to either the relevant original element or the relevant transformed element and hence these are not valid vertical interconnect positions. Similarly, in the case of overlaid patterns 325 from the second interface, the four corner conductive bond elements and the central conductive bond elements align very well and are valid vertical interconnect positions. However, the upper central conductive bond element 340 has transformed to the centre right position 345 and hence neither position is a valid vertical interconnect position.

It should be understood that the illustration of FIG. 5 can be considered as an illustration of the present technique being applied to a single interface (wherein the "first interface" and "second interface" are alternative examples of what that single interface could look like) or as an illustration of the present technique being applied to two interfaces (wherein the "first interface" and "second interface" then shown what each of those interfaces look like).

Figure 6:
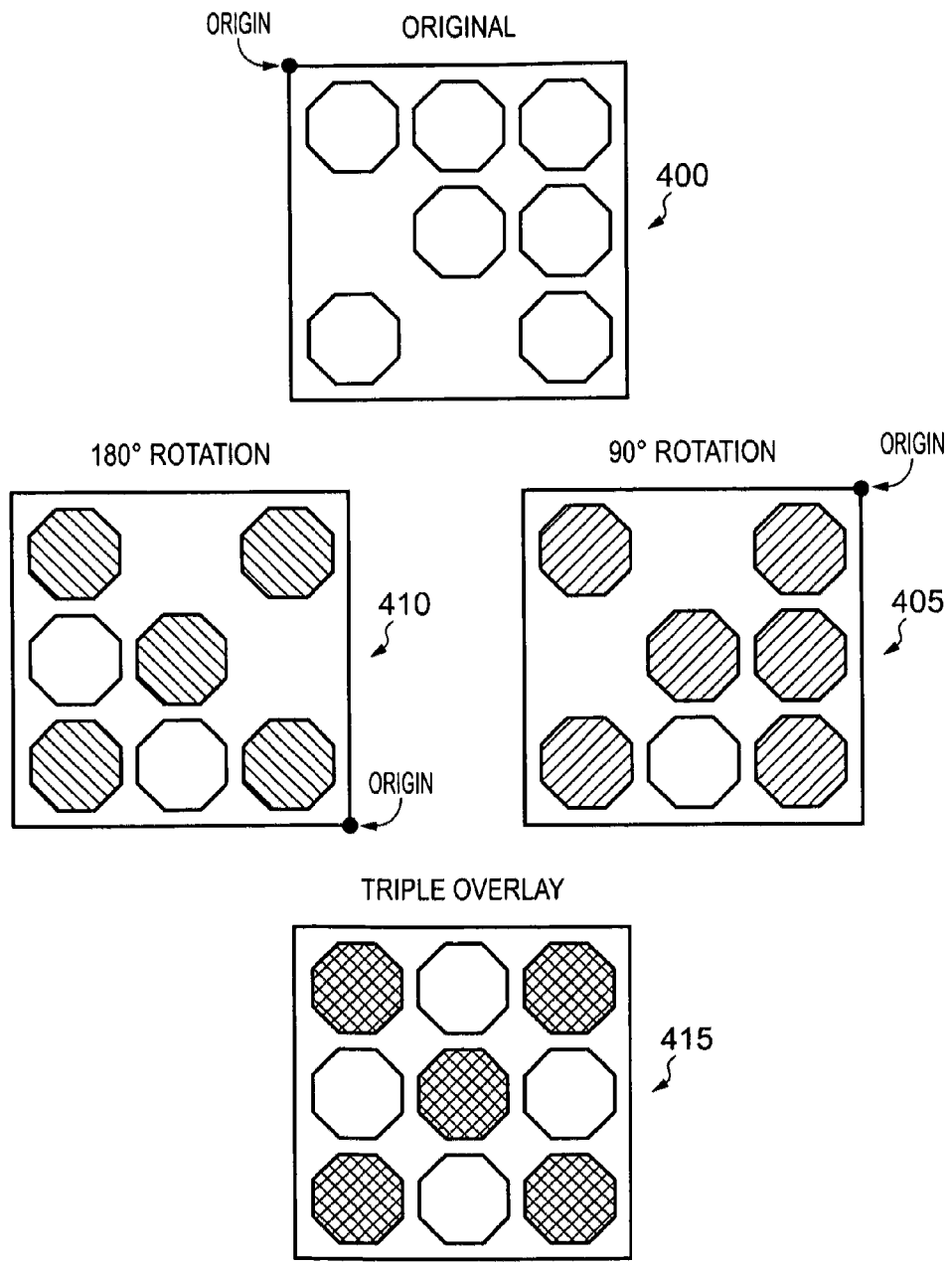
FIG. 6 schematically illustrates the determination of valid vertical interconnect positions in association with multiple transformations in one embodiment.

In the example of FIG. 5 only one transformation (a 90 degree clockwise rotation) is considered, but as explained above with reference to FIG. 4, it may be desirable to consider several transformations simultaneously, to allow the module to be repositioned in a number of different ways in the integrated circuit. FIG. 6 illustrates a relatively simple example of this (for clarity of illustration) in which a 90 degree clockwise rotation and a 180 degree rotation are considered. Note that here (again for clarity of illustration) only the selected search region in one interface is shown. This example could be the one interface under consideration, or it could be one of several interfaces under consideration. In FIG. 6 a similar pattern to that of the second interface in FIG. 6 is shown, except that an additional conductive bond element has been added at the centre right position in the original pattern 400.

Pattern 405 shows the original pattern 400 subjected to a 90 degree clockwise rotation, whilst pattern 410 shows the original pattern 400 subjected to a 180 degree rotation. Note that the hatched elements in patterns 405 and 410 mark those elements which would represent valid vertical interconnect positions if the respective transformation were the only one under consideration. Note that pattern 405 has six valid positions, whilst pattern 410 only have five due to the particular configurations. However, pattern 415 shows the triple overlay of patterns 400, 405 and 410. Here only five conductive bond elements represent valid vertical interconnect positions with respect to all three patterns.

It should be noted that for simplicity of illustration the original and transformed conductive bond elements in FIG. 6 are shown as aligning directly with one another. It should however be appreciated that perfect alignment of the original and transformed conductive bond elements with one another is not necessary for a valid vertical interconnect position to be established. Rather, as discussed with respect to FIG. 5, an overlap between the original and transformed conductive bond elements may be sufficient to allow a valid vertical interconnect position so long as that overlap area is sufficiently large for a vertical interconnect to be placed (i.e. such that it would not violate the placement rules for vertical interconnects with respect to conductive bond elements, e.g. minimum distance from edge of conductive bond element, which may be given as manufacturing rules or may be given by the system designer).

Figure 7A:
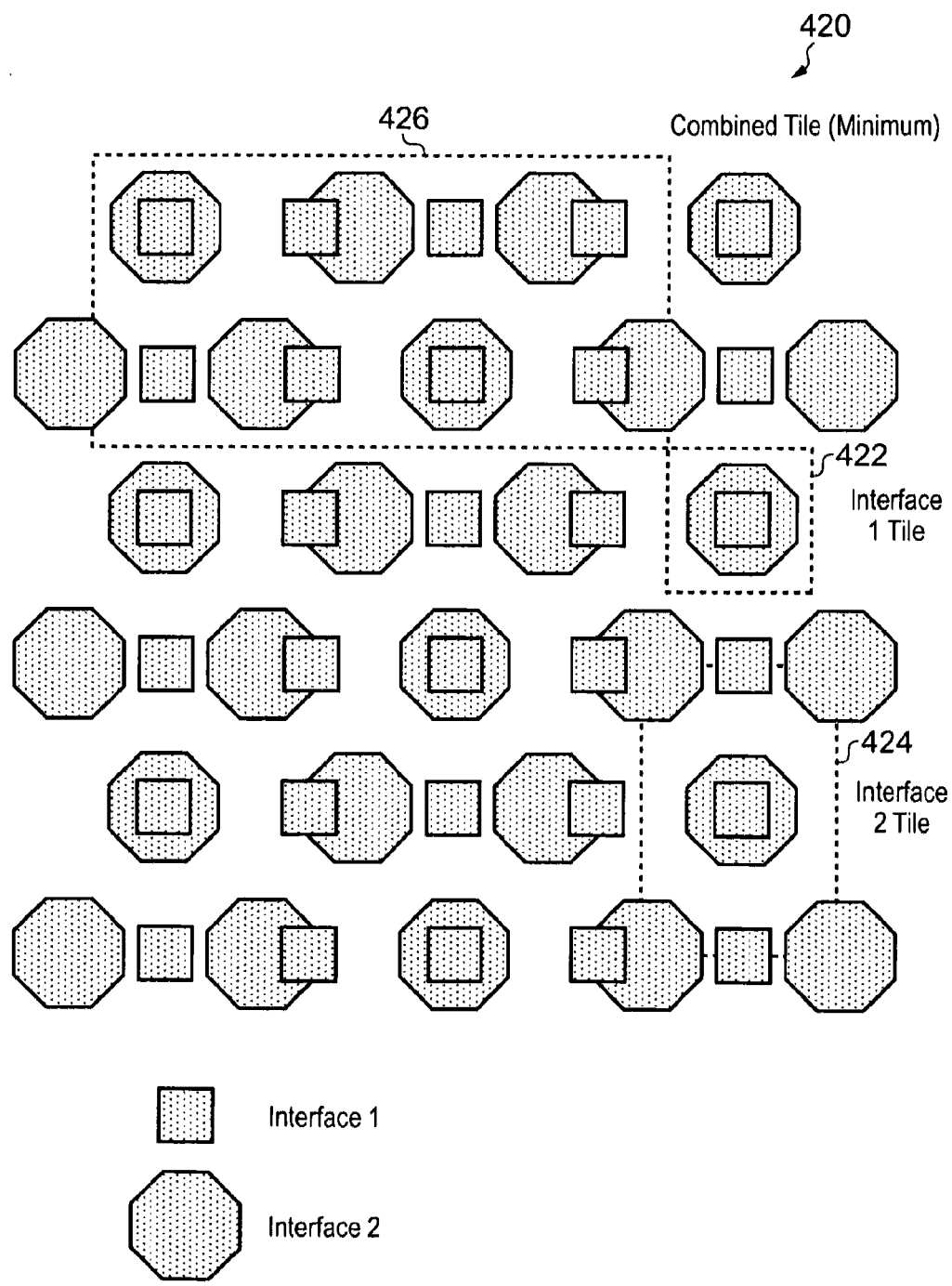
FIG. 7A schematically illustrates a combined pattern formed by overlaying the conductive bond patterns of two interfaces.

FIG. 7A schematically illustrates a combined pattern formed by overlaying the conductive bonding element patterns of two interfaces, namely "interface 1" and "interface 2". The dashed boxes 422 and 424 show the "tiles" or "sub-patterns" within the patterns of the conductive bonding elements of interface 1 and interface 2 respectively. In other words, the tiles 422 and 424 show the minimum sub-unit of each pattern which tessellates across the pattern, i.e. multiple adjacent (both horizontally and vertically) instances of these individual tiles make up the whole pattern of that interface. Also illustrated by a dashed box in FIG. 7A is the combined tile 426 which illustrates the minimum sized tessellating tile within the combined pattern.

Figure 7B:
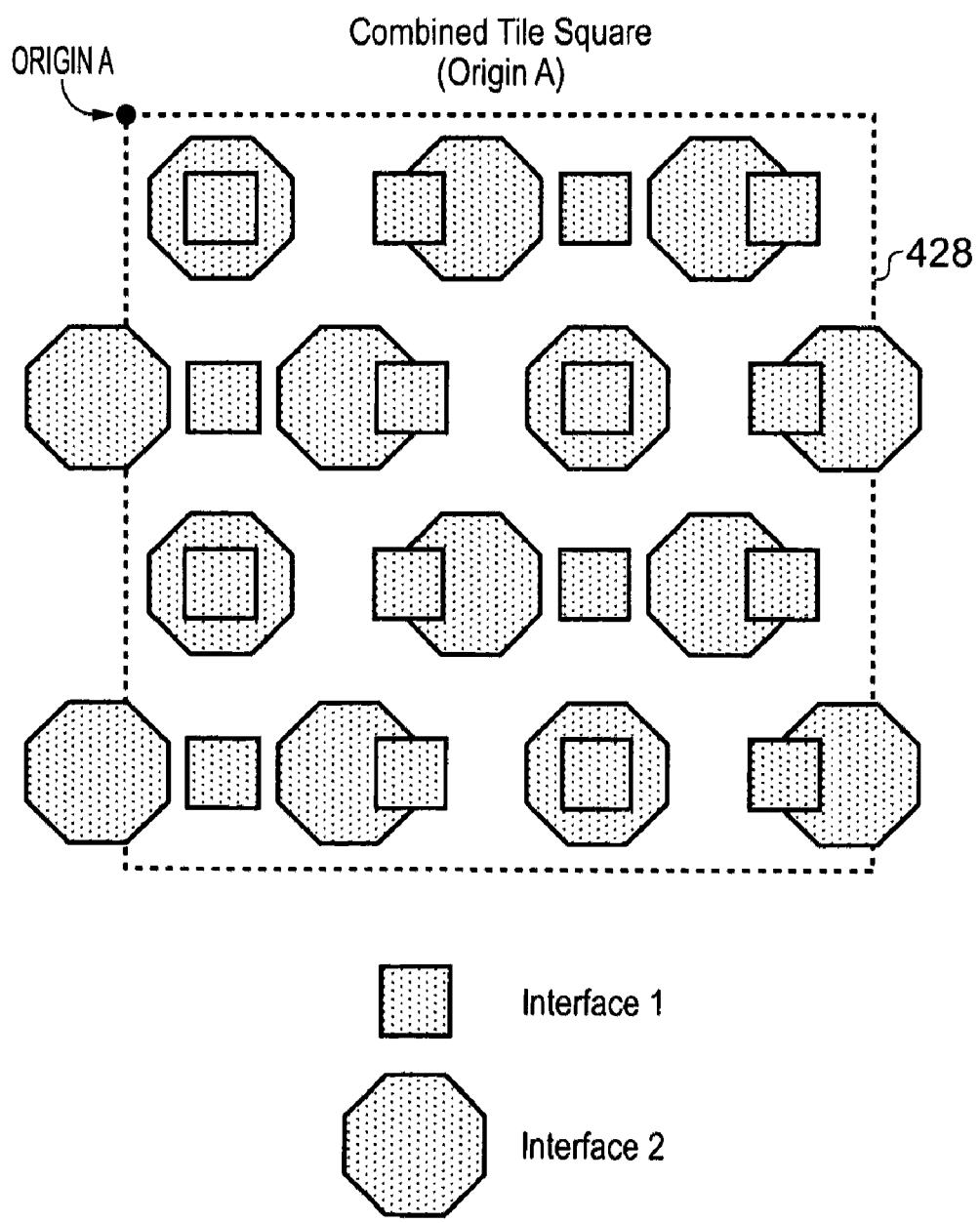
FIGS. 7B-7G schematically illustrate for the combined pattern of FIG. 7A the influence of the choice of tile and origin on the number of resulting valid interconnect positions.

Turning to FIG. 7B, the same combined pattern formed by the overlay of interface 1 and interface 2 is shown, however here the dashed box 428 shows a tile which is larger than the minimum tile 426 for the combined pattern shown in FIG. 7A. This sub-region 428 has been selected because it is square and, although this is not strictly necessary, this facilitates the consideration of transformations which include rotations. Note also that the origin A of this tile 428 has been placed at its corner (and as mentioned above, the choice of which particular corner of the tile is considered to be the origin is arbitrary because of the tile's tessellation). However, more significant is the positioning of the origin and the corresponding tile size with respect to the combined pattern. The following discussion illustrates this point with respect to FIGS. 7B-D (Origin A) and FIGS. 7E-G (Origin B). Comparison of these two sets of figures illustrates that origins A and B have been selected at slightly different positions within the combined pattern of interfaces 1 and 2, with two different corresponding sizes of tile, and the effect this choice has on the resulting valid interconnect positions can clearly be seen.

Figure 7C:
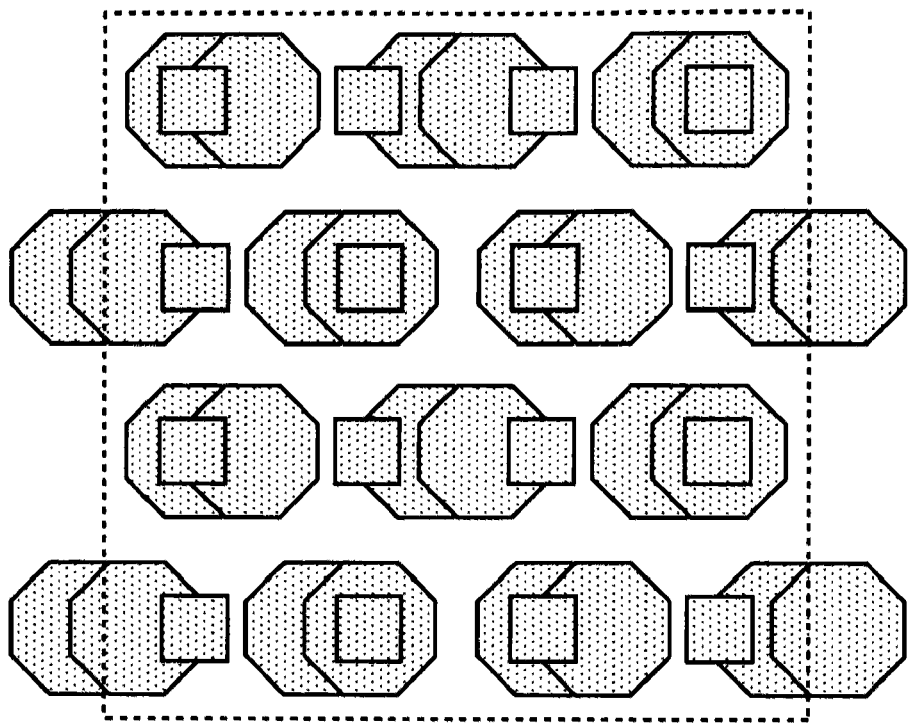
Figure 7C:
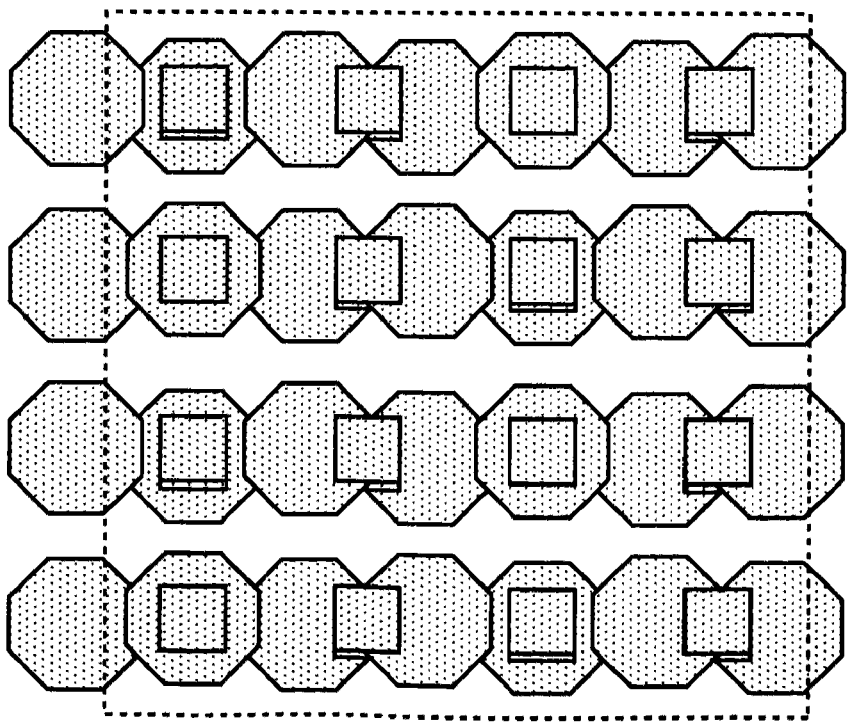
Figure 7D:
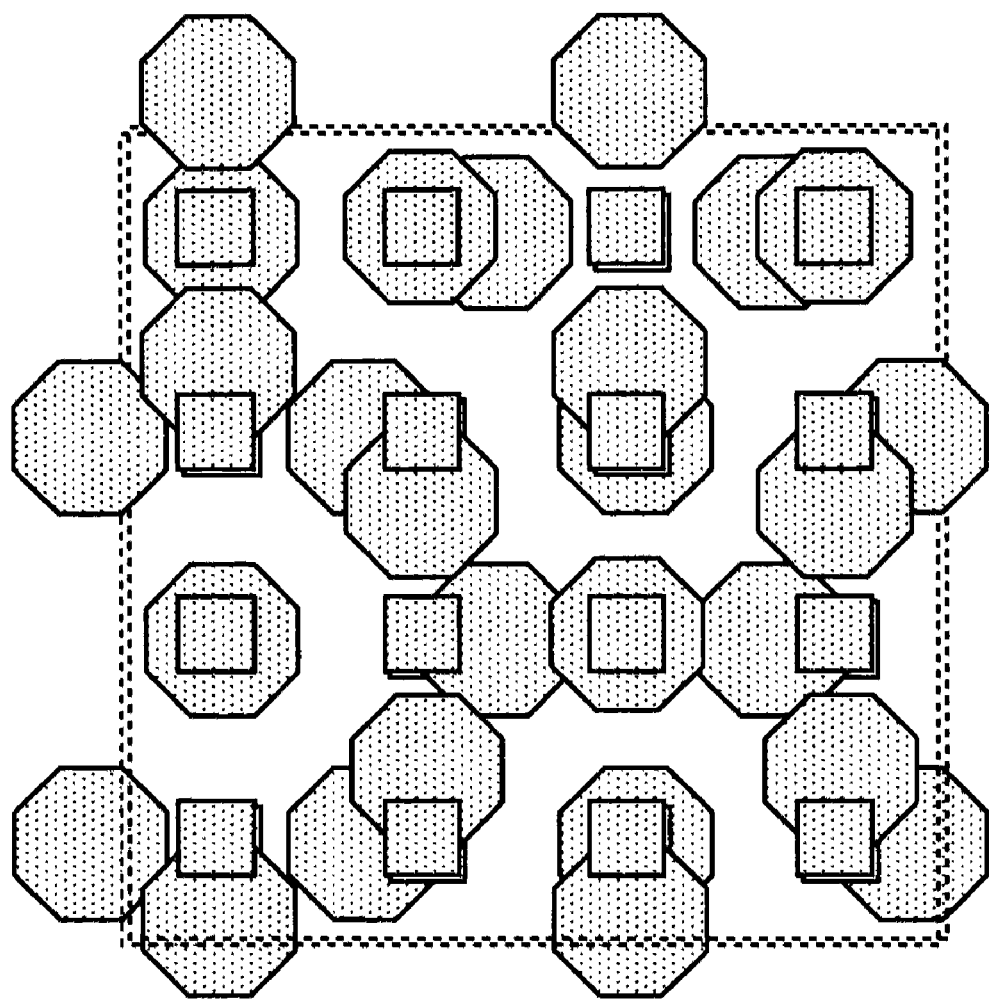

FIG. 7C illustrates the results of applying a reflectional (mirror) transformation in the x and y directions to the Origin A scenario. It can readily be seen that although there is very good overlap between the pre- and post-transformation versions of the elements of interface 1, the self-coincidence of the elements of interface 2 is only moderate for the y-reflection and is very poor for the x-reflection. Indeed the "mirror x" transformation essentially does not allow any valid interconnect positions for the interface 2 elements. Turning to FIG. 7D, it can similarly be seen that the 90 degree rotation (R90) maps the elements of interface 1 onto themselves rather well, but the transformation of the interface 2 elements does not map these interface 2 elements onto themselves particularly well, only resulting in a few possibilities for interconnects.

Figure 7E:
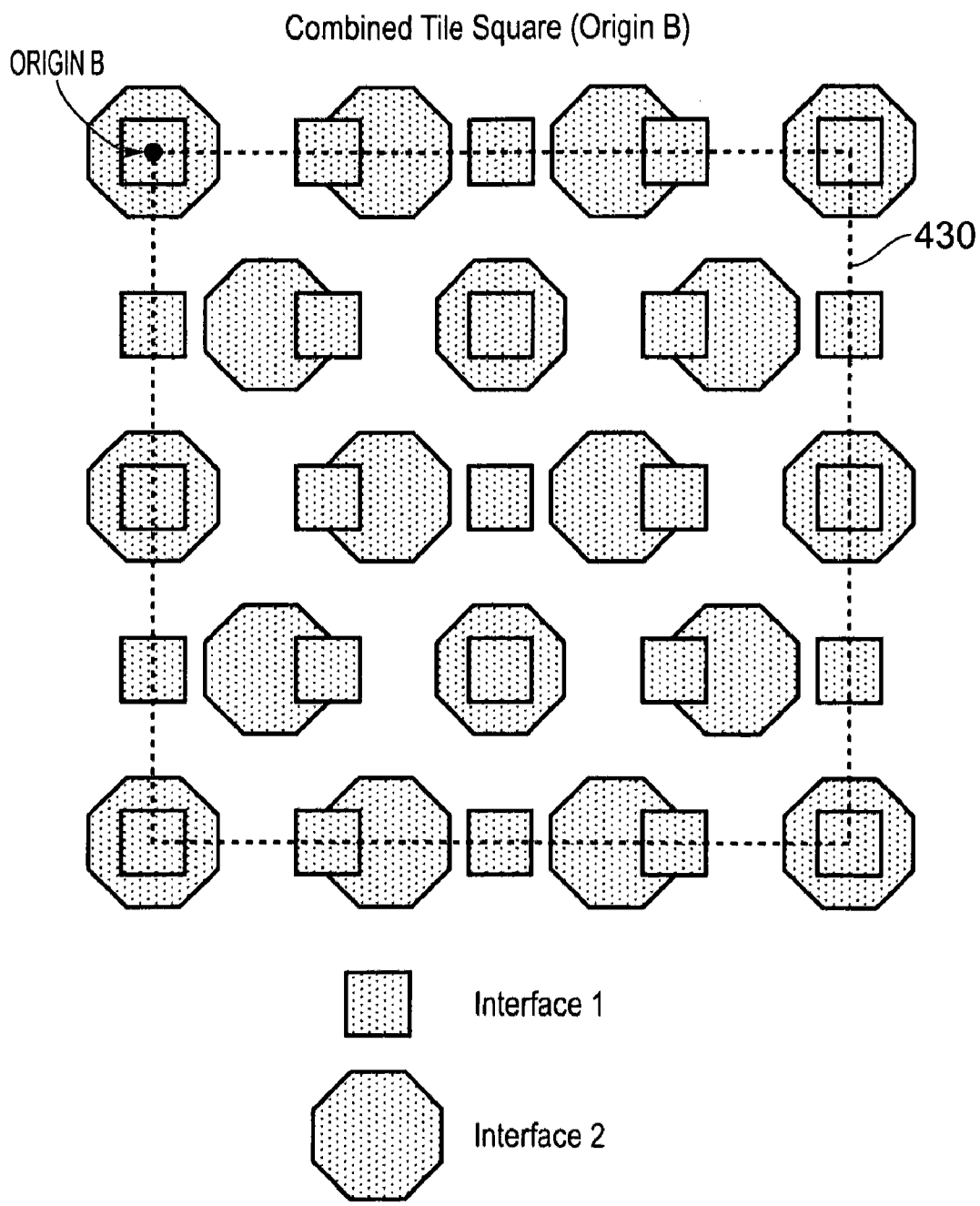
Figure 7F:
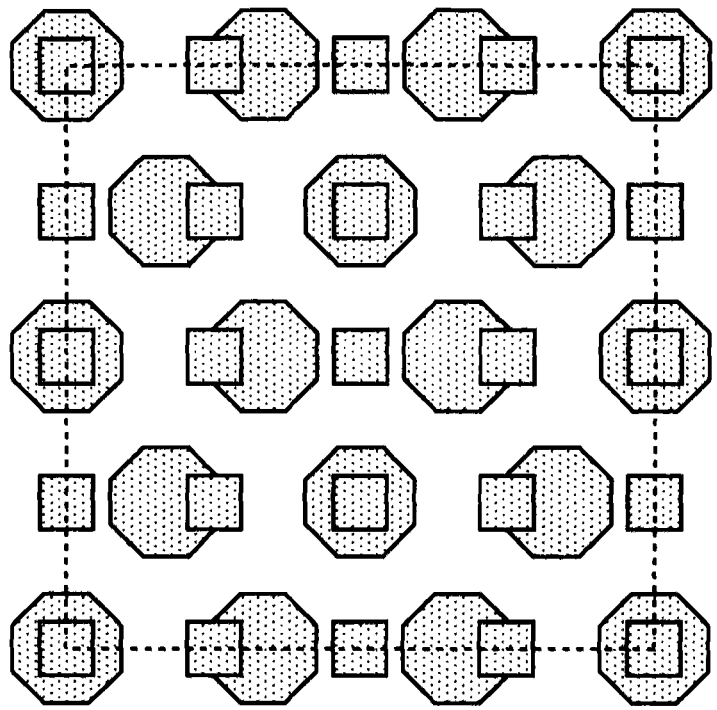
Figure 7F:
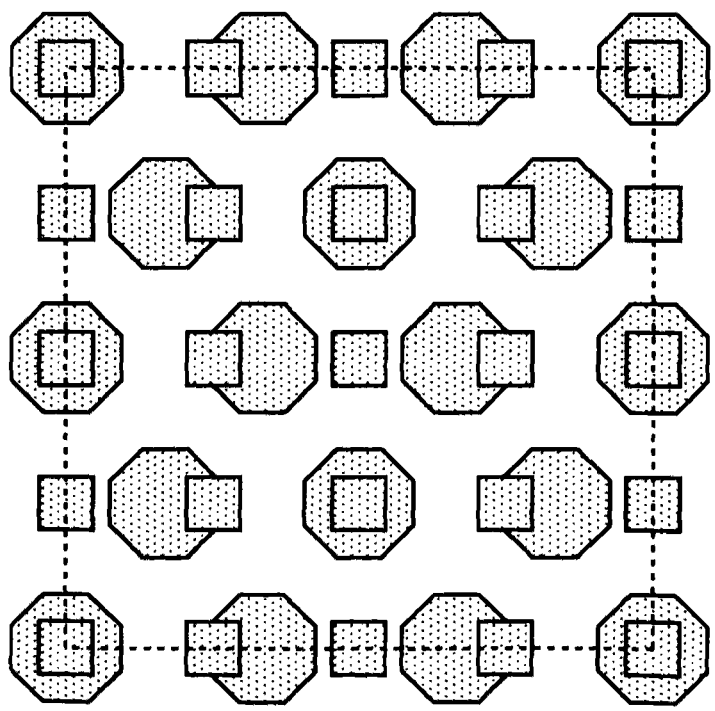
Figure 7G:
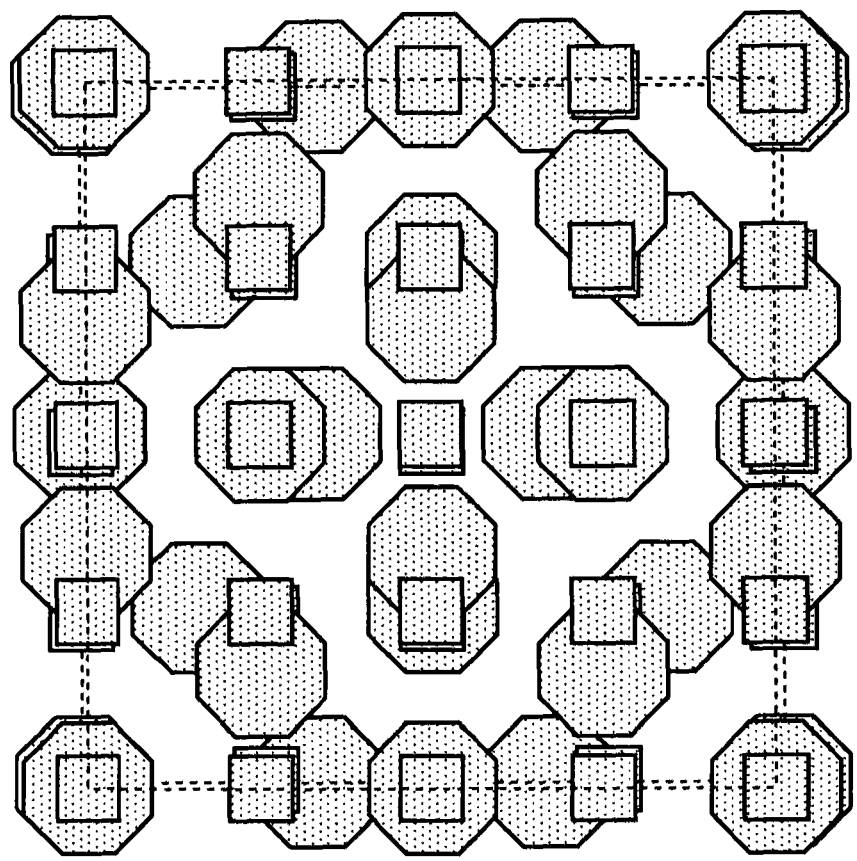

A different choice of origin and sub-region is now illustrated in FIG. 7E, it being clearly visible that the corner of the sub-region aligns with a point where an element from interface 1 and interface 2 coincide and furthermore that the sub-region is larger, comprising a 5×5 set of elements from interface 1 rather than a 4×4 set of elements as interface 1 as was the case in FIGS. 7B-7D. The improvement of this choice of origin and sub-region (tile) 430 is evident from a consideration of the same transformations (mirror y, mirror x and R90) illustrated in FIGS. 7F and 7G when applied to this tile 430. It can clearly be seen that the mirror operations map the elements of each interface essentially directly onto themselves, whilst the R90 transformation provides very good overlap for the interface 1 elements and various reasonable overlaps for the interface 2 elements. Overall therefore, Origin B and tile 430 would be the preferable choice over Origin A and tile 428 due to the greater number of valid interconnect positions which result.

Figure 8A:
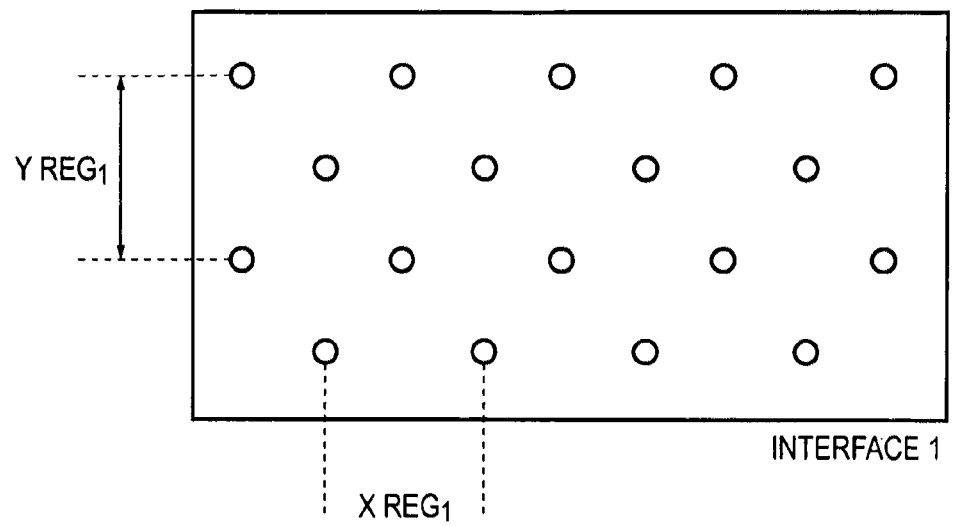
FIGS. 8A and 8B schematically illustrate the determination of the regularity distances for two interfaces in one embodiment.
Figure 8B:
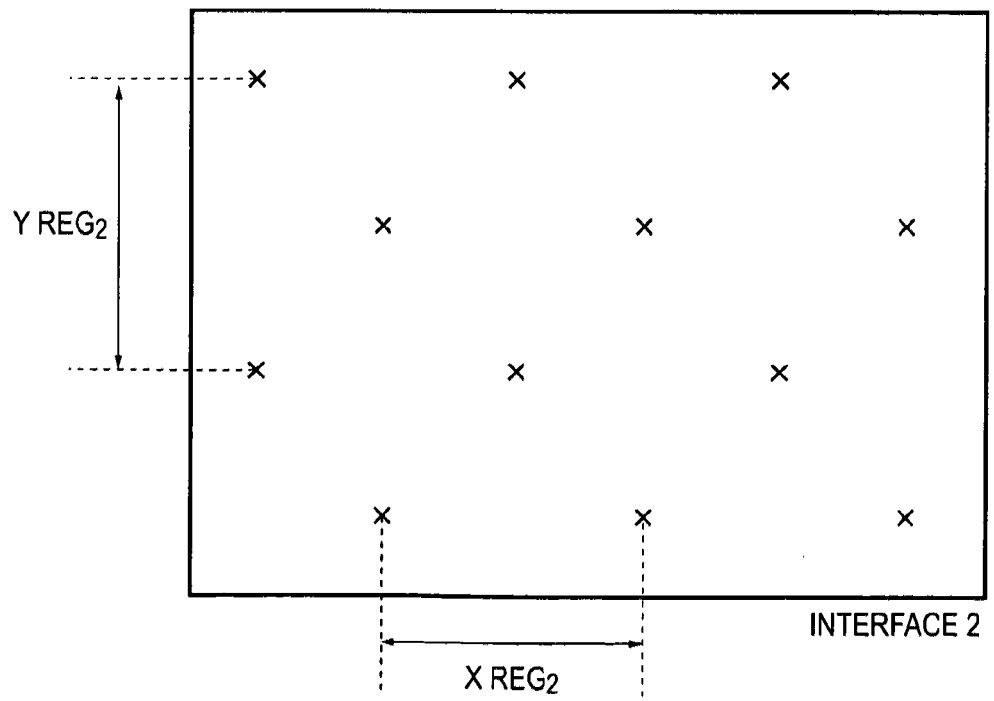

With regard to the process of determining a valid transformation origin and search region (sub-region), FIGS. 8A and 8B schematically illustrate how the regularity distance for the bond point patterns in two interfaces may be determined.

For clarity of illustration, full-sized bond points are not shown, but rather points (o's for interface 1 and x's for interface 2) representing the centres of each bond point (for each interface the shapes of the bond points are regular). $XREG_1$ represents the distance over which the elements in interface 1 repeat in the x direction whilst $YREG_1$ represents the distance over which the elements repeat in the y direction in interface 1. Similarly $XREG_2$ represents the distance over which the elements in interface 2 repeat in the x direction and $YREG_2$ represents the distance over which the elements in interface 2 repeat in the y direction. Thus determined a lowest common multiple (LCM) calculation with respect to each axis gives the regularity distance at which the combined pattern (interface 1 pattern overlaid on interface 2 pattern) repeats in each direction. The two LCM distances then define a selected search region (sub-region) in which the effect of the desired transformation(s) can be examined, in the knowledge that the repeating (tessellating) pattern means that the effect of the transformation(s) can be extrapolated to the entirety of the interfaces.

Figure 9:
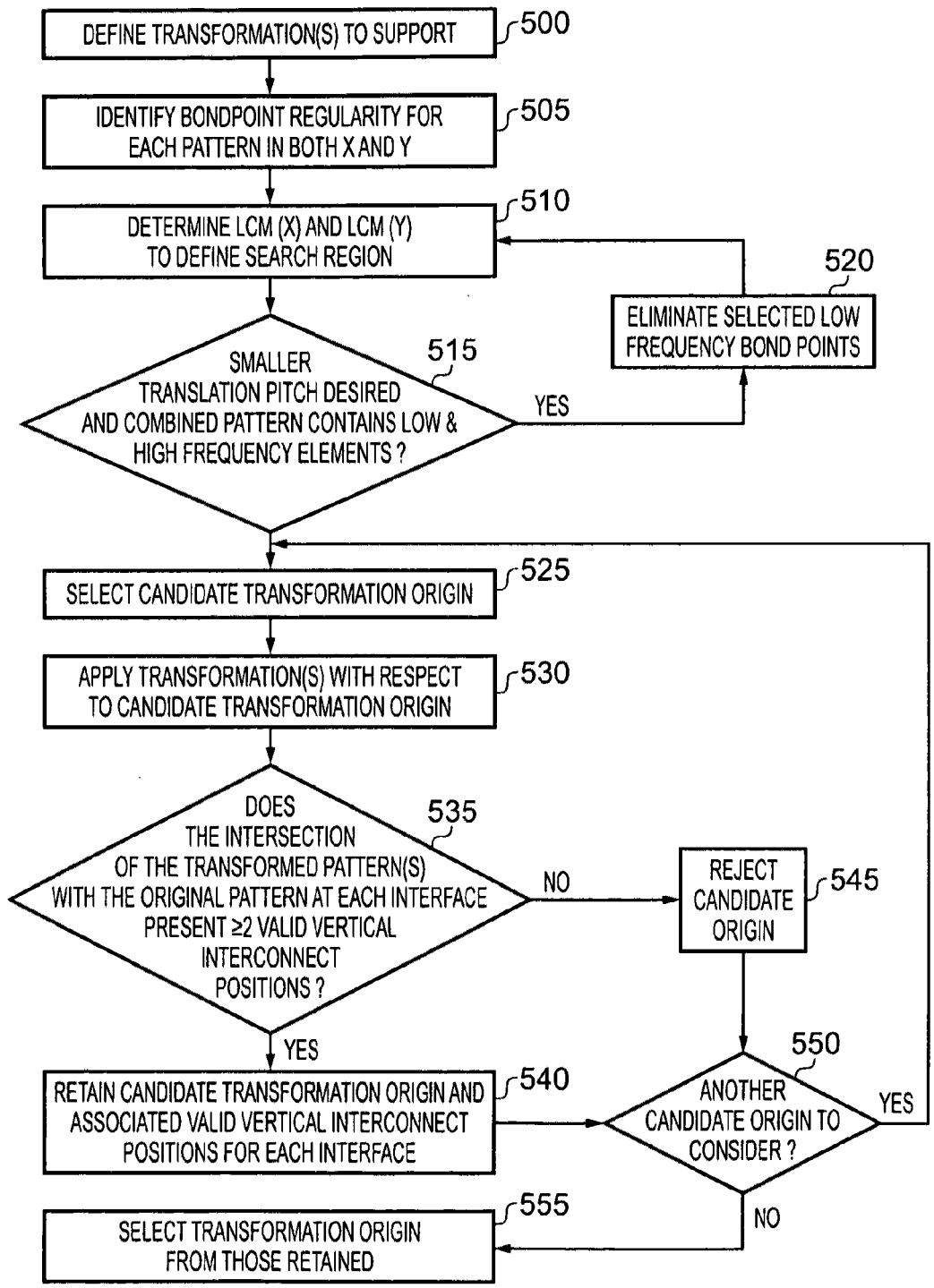
FIG. 9 schematically illustrates a series of steps carried out in order to determine a valid transformation origin and associated valid vertical interconnect positions in one embodiment.

FIG. 9 illustrates a series of steps which may be carried out in one embodiment. Initially at step 500 the transformation or transformations to be supported are defined. Then at step 505 the bondpoint regularity for the pattern in each interface being considered is determined in both the x and y direction. At step 510, the lowest common multiples for the x and y regularity values at each interface are determined to define the selected search region to be examined. If a rotational transformation is being supported it may be elected to determine only one lowest common multiple value from all the x and y regularity values, such that the search region is square, simplifying the examination of rotational transformations.

At step 515 it is determined if the combined pattern (the overlaid pattern of each interface pattern under consideration) contains both high and low frequency elements and if a smaller translation pitch (the size of the selected search region representing the smallest translation that can be performed on the module) is desired. If both these are true, then the flow loops back via step 520, where selected low frequency bond points are eliminated to reduce the size of the search region. This process will be described below in more detail with reference to FIG. 10.

Once the selected search region is established, then at step 525 a candidate transformation origin is selected. In one embodiment an iterative candidate transformation origin selection process is carried out, wherein possible locations are scanned across in turn and the step size between the selected candidate origins is given by the minimum manufacturing step size for the process at which the integrated circuit is being manufactured. Note that if more than one process is being used (different layers being produced at different processes) then the largest of the minimum manufacturing step sizes is taken.

The predetermined transformation(s) are then applied to the pattern at each interface within the selected search window with respect to the candidate transformation origin (step 530) and at step 535 it is determined if the intersection of the transformed pattern(s) with the original pattern at each interface results in two or more valid vertical interconnect positions. Note that the choice of how many valid interconnect positions should result can vary from example to example (e.g. in dependence on the size of the search region) and "at least two" positions is merely an example rule here. If this is true, then at step 540 this candidate transformation origin is determined to be a valid transformation origin for the predetermined transformation(s) and is retained, along with the valid vertical interconnect positions at each interface that were determined in association therewith. Otherwise (step 545) the candidate transformation origin is rejected.

At step 550 it is determined if another candidate transformation origin is to be considered (for example by the above mentioned iterative process). If so the flow returns to step 525. Otherwise at step 555 a transformation origin to be used is selected from those retained at step 540. The set of valid vertical interconnect positions thus selected can then be stored or output, or may then be used straight away as the basis for forming a first module to be used in the integrated circuit. This first module can then be transformed with respect to this origin with the predetermined transformation(s).

Figure 10:
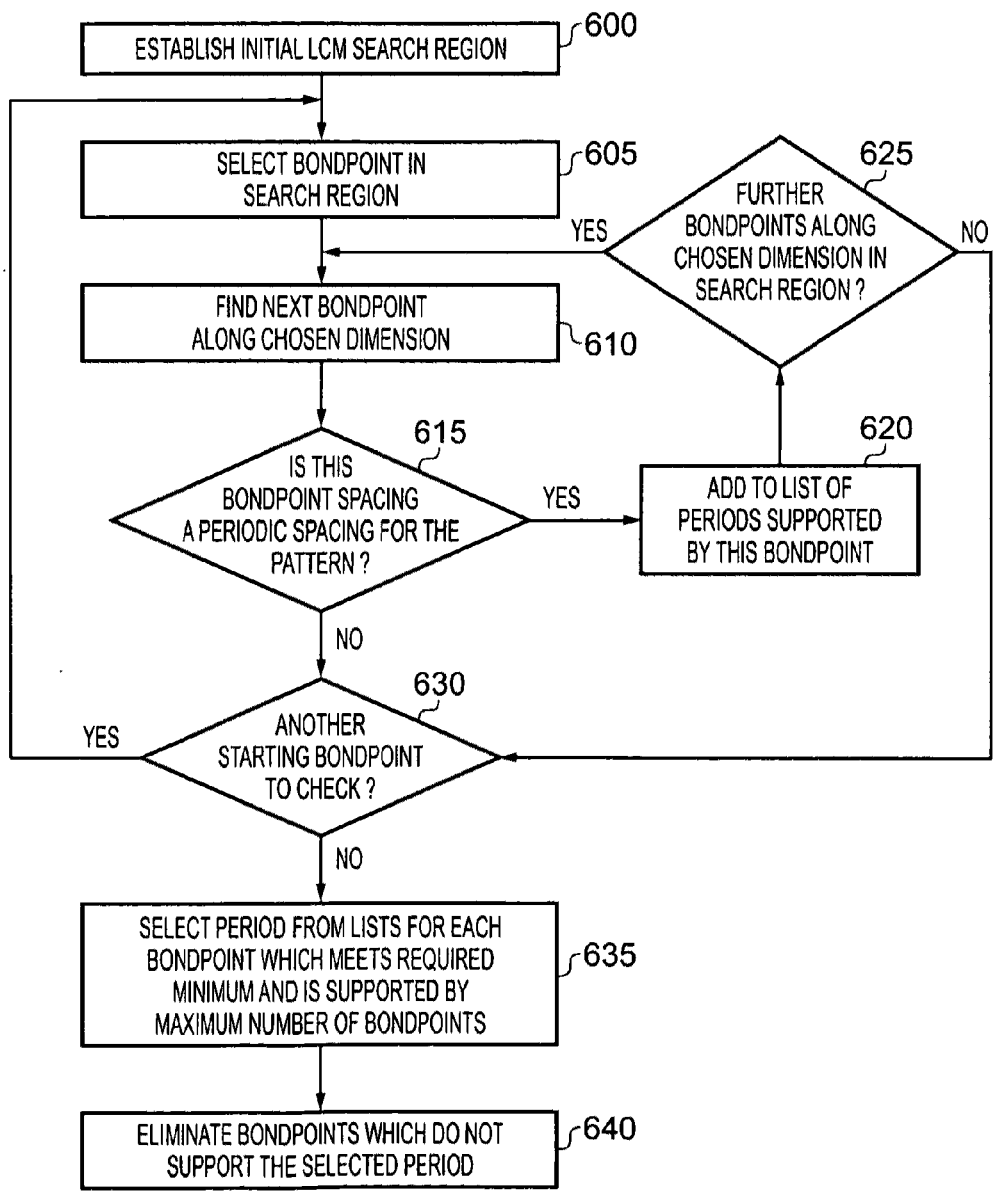
FIG. 10 schematically illustrates a series of steps by which the search region size may be reduced in one embodiment.

The process for reducing the selected search region is now described with reference to FIG. 10. The process is described with respect to a chosen direction (e.g. along the x-axis) and can be performed either with respect to just one axis (if it is desired to reduce the search region size only in that dimension) or can be performed with respect to both axes. Further, the process may be performed with respect to just a single interface, or may be applied to a combined pattern of multiple interfaces.

Starting with an initial search region (step 600), firstly a bond point within the selected search regions is selected (step 605). Then the distance to the next bond point along the chosen dimension is determined (step 610). Thus found, it is determined if the distance represents a periodic spacing for the pattern (not only within the current search region but across the whole interface). If this periodicity is true then at step 620, this distance is added to a list of periods supported by this bond point (the bond point selected at step 605). Next it is determined at step 625 if there are further bond points within the search region along the chosen dimension, and if there are the flow returns to step 610 to determine the relevant distance.

If a distance at step 615 is determined not to be periodic for the pattern or if there are no further bond points along the chosen dimension so consider at step 625 then the flow proceeds to step 630. Here it is determined if there is another starting bond point to consider. If another starting bond point can be considered, the flow returns to step 605. Otherwise at step 635 a period is selected from the lists built up for the bond points which meets the required minimum (i.e. is less than the existing search region corresponding dimension) and is supported by the maximum number of bond points. Then at step 640 any bond points in the search region which do not support the selected period are eliminated. A fresh determination of the LCM search region (steps 505 and 510 in FIG. 9) will then result in a correspondingly reduced size of search region.

Figure 11:
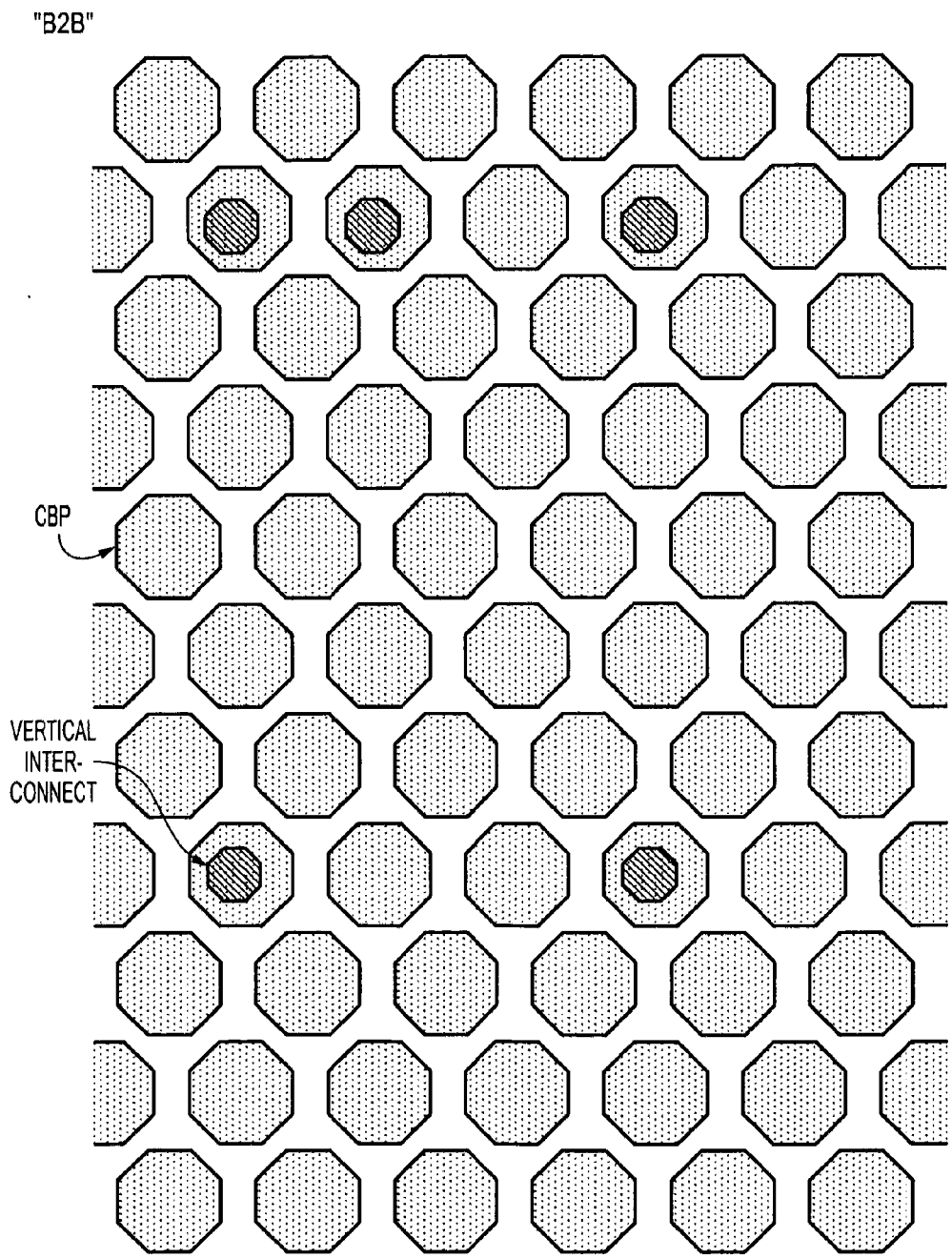
FIG. 11 illustrates an example first bonding interface conductive bond pattern in one embodiment.
Figure 12:
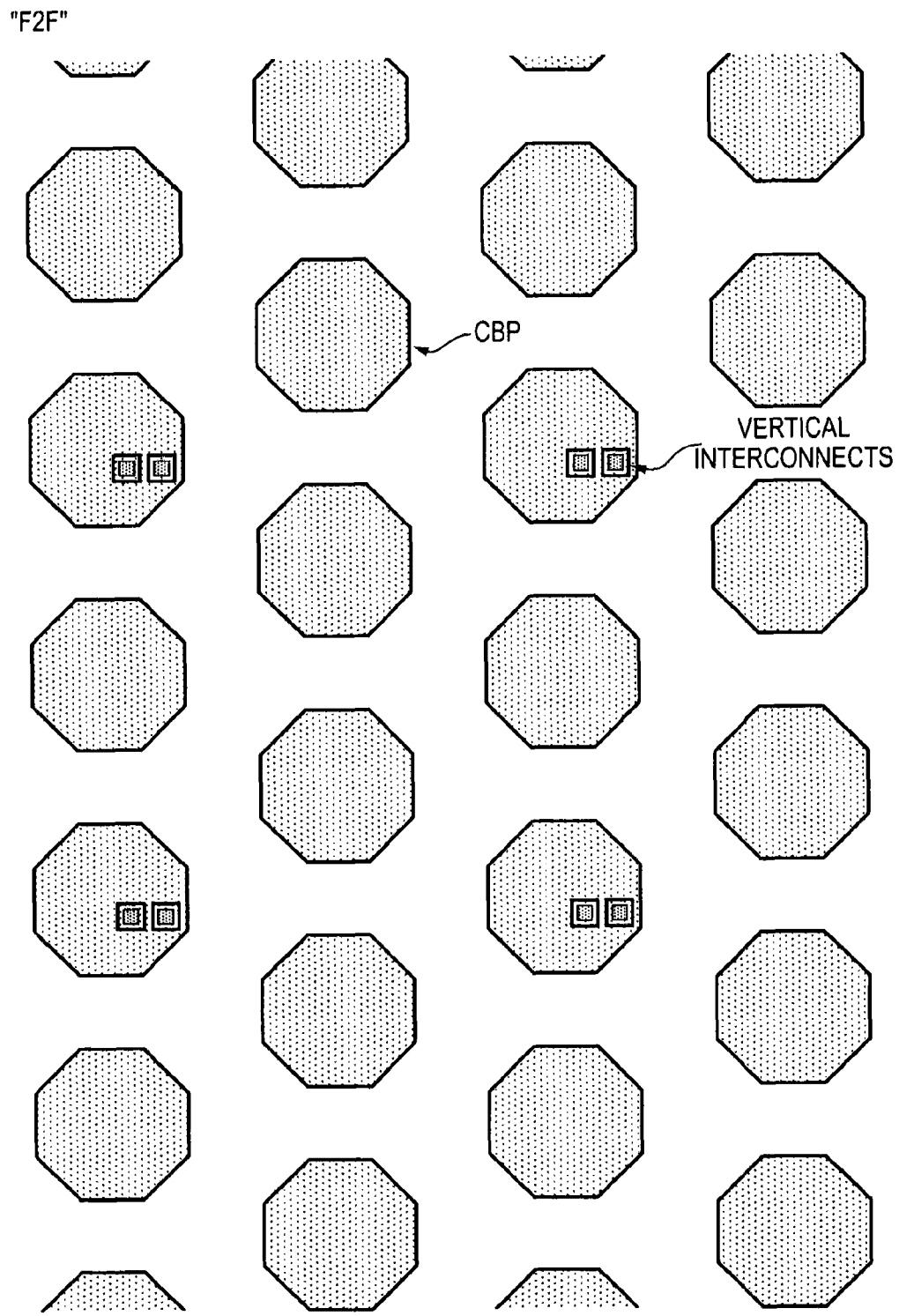
FIG. 12 illustrates an example second bonding interface conductive bond pattern in one embodiment.
Figure 13:
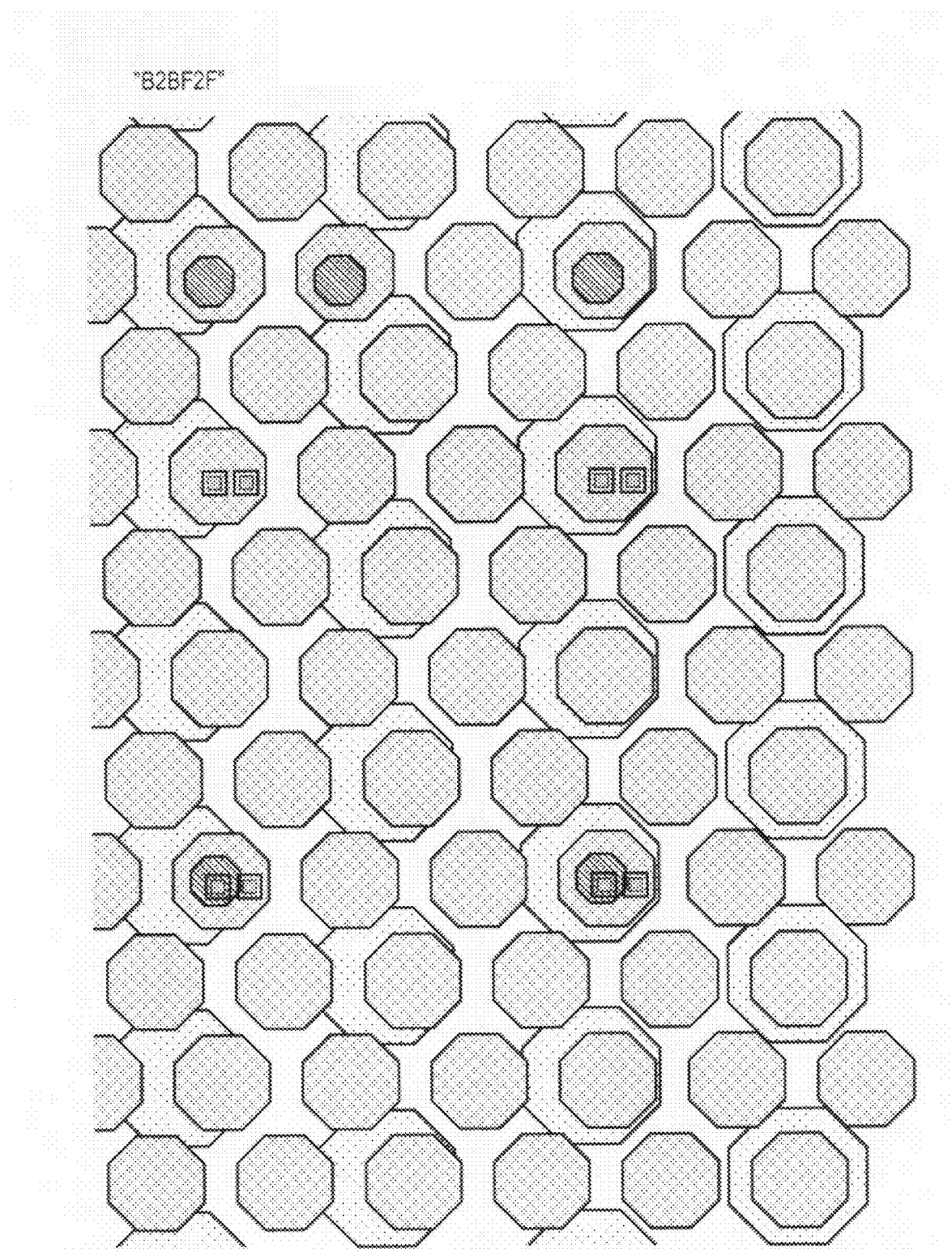
FIG. 13 illustrates the overlay of the conductive bond patterns of FIGS. 11 and 12.

FIGS. 11 and 12 show some example copper bond point patterns from two different interfaces which will form part of a 3D integrated circuit. These are illustrated to scale with one another, so that the difference in size and pattern of the two sets of copper bond points can be appreciated. Example vertical interconnects are shown on each pattern. Note that for yield reasons, the vertical interconnects in FIG. 12 have been placed as pairs. FIG. 13 shows the combined pattern when the FIGS. 11 and 12 patterns are overlaid.

Figure 14:
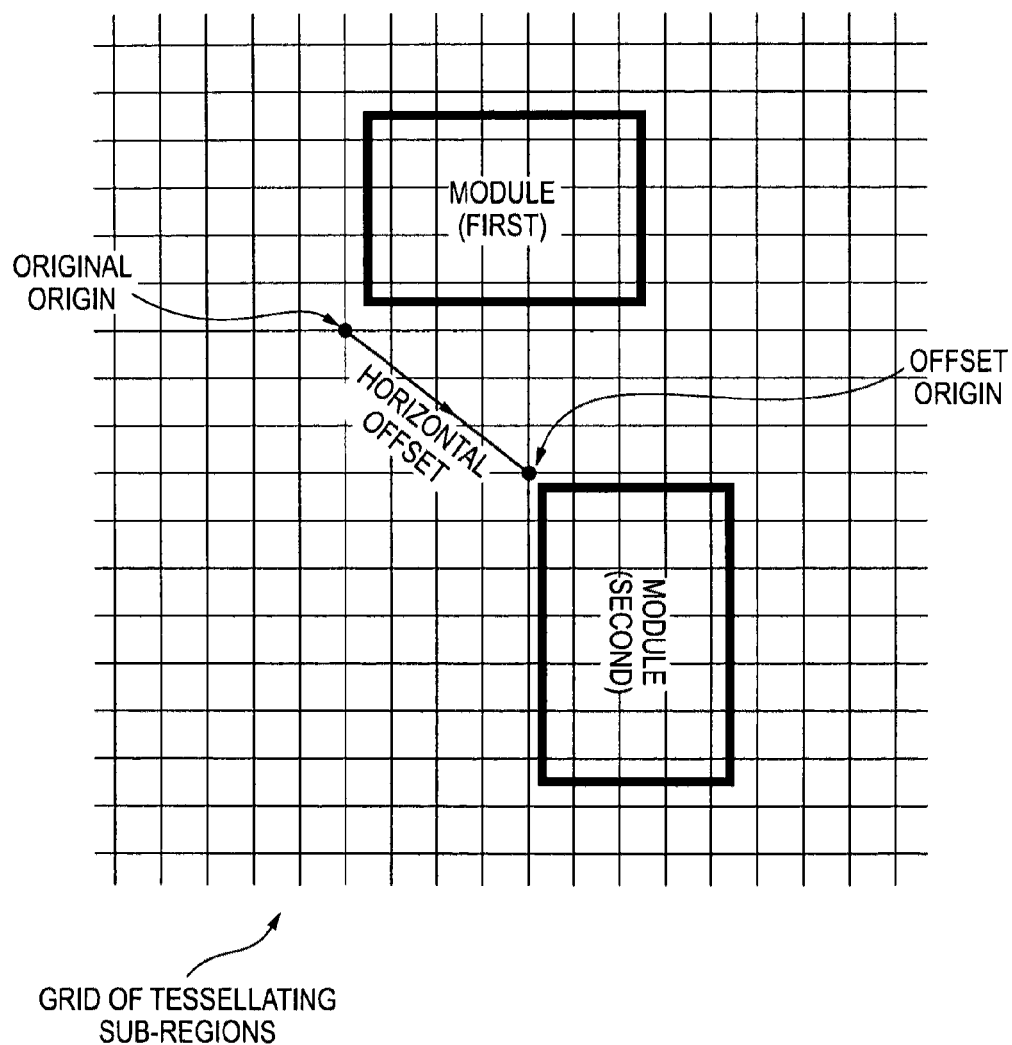
FIG. 14 schematically illustrates the positioning of modules with respect to sub-regions in one embodiment.
Figure 15:
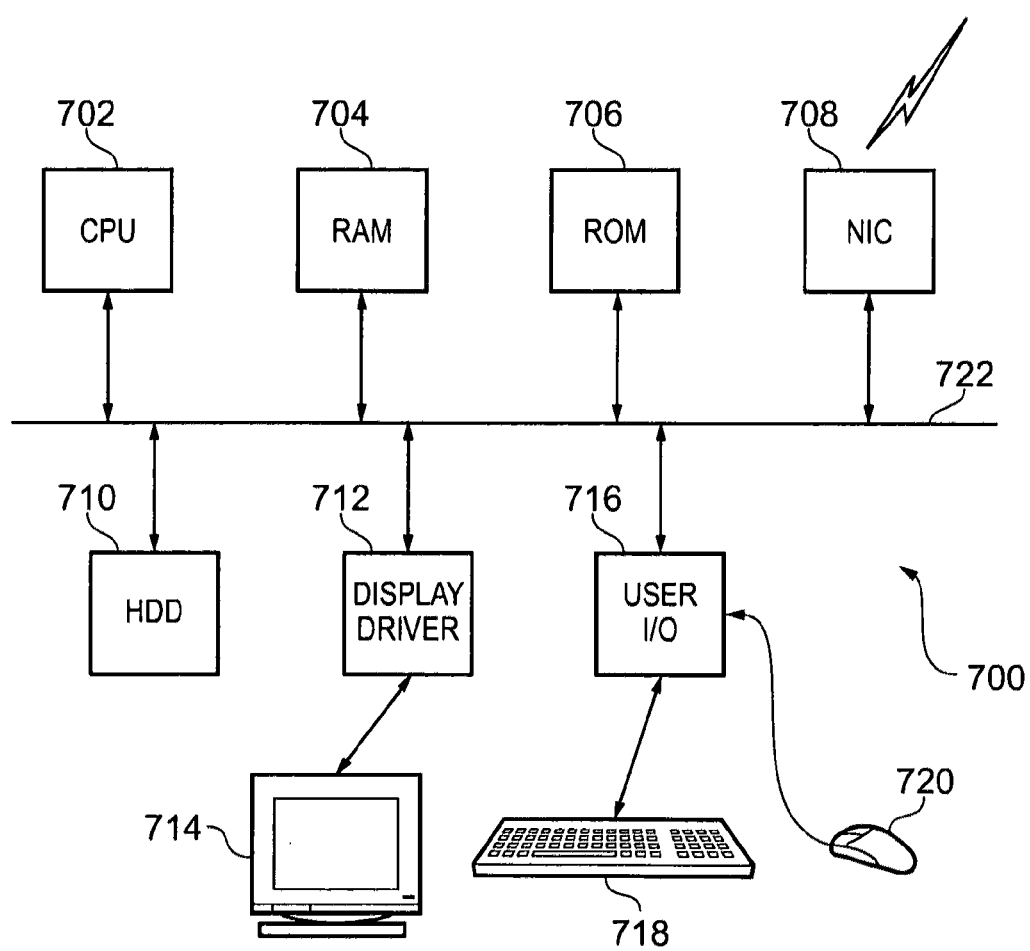
FIG. 15 schematically illustrates a general purpose computer on which the techniques of the present invention may be carried out.

FIG. 14 schematically illustrates the placement of a first and second module in the multiple layer integrated circuit with respect to the chosen sub-regions which tessellate across the horizontal plane of the integrated circuit. The second module results from an 90 degree clockwise (R90) rotation of the first module, followed by displacement by a horizontal offset. Note in particular that the horizontal offset places the offset origin at the same relative place in the grid formed by the tessellating sub-regions. For clarity of illustration this position is shown as the corner where four sub-regions meet, but it should be appreciated that this is not a requirement and any position relative to the sub-region may in principle be used. Thus placed, the previously described steps of selecting the valid vertical interconnect positions, according to which the first module has been arranged, mean that the second module will also align with valid vertical interconnect positions, even though rotated and offset. The ability for the system designer to thus just "drag and drop" copies of the first module like this greatly facilitates the design process.

It will be recognised that of the process of designing an integrated circuit is commonly performed on a computing platform. In this context the set of valid vertical interconnect positions may be stored in a non-transient fashion on a computer-readable storage medium such that it may subsequently be used generate the arrangement of the integrated circuit and equally the arrangement may be stored in a non-transient fashion on a computer-readable storage medium such that it may subsequently be used to configure the manufacture of the integrated circuit. FIG. 14 schematically illustrates a general purpose computing device 700 of the type that may be used to implement the above described techniques. The general purpose computing device 700 includes a central processing unit 702, a random access memory 704 and a read only memory 706, connected together via bus 722. It also further comprises a network interface card 708, a hard disk drive 410, a display driver 712 and monitor 714 and a user input/output circuit 716 with a keyboard 718 and mouse 720 all connected via the common bus 722. In operation, such as when executing data processing instructions which include an instruction configured to cause the device to carry out the present techniques, the central processing unit 702 will execute computer program instructions that may for example be stored in the random access memory 704 and/or the read only memory 706. Program instructions could be additionally retrieved from the hard disk drive 710 or dynamically downloaded via the network interface card 708. The results of the processing performed may be displayed to a user via a connected display driver 712 and monitor 714. User inputs for controlling the operation of the general purpose computing device 700 may be received via a connected user input output circuit 716 from the keyboard 718 or the mouse 720. It will be appreciated that the computer program could be written in a variety of different computer languages. The computer program may be stored locally on a recording medium or dynamically downloaded to the general purpose computing device 700. When operating under control of an appropriate computer program, the general purpose computing device 700 can perform the above described techniques and can be considered to form an apparatus for performing the above described techniques. The architecture of the general purpose computing device 700 could vary considerably and FIG. 14 is only one example.

In overall summary a method of generating a set of valid vertical interconnect positions for a multiple layer integrated circuit, a method of generating an arrangement of a multiple layer integrated circuit and a resulting multiple layer integrated circuit are disclosed. The multiple layer integrated circuit comprises multiple layers stacked vertically above one another and having a bonding interface between at least one pair of layers. The bonding interface is formed by the coupling of a pair of conductive bond patterns formed on facing surfaces of the pair of layers. The method of generating the set of valid vertical interconnect positions comprises the steps of: defining a candidate transformation origin; defining a sub-region which tessellates across the conductive bond pattern; applying a predetermined transformation with respect to the candidate transformation origin to the conductive bond pattern at the bonding interface; determining the validity of the candidate transformation origin in dependence on coincidence of at least a subset of the original conductive bond pattern elements with the transformed conductive bond pattern elements; selecting a valid transformation origin; defining a set of valid vertical interconnect positions associated with the valid transformation origin at positions in the bonding interface where the original and transformed conductive bond pattern elements coincided with each other; and outputting said set of valid vertical interconnect positions. The method of generating the arrangement of a multiple layer integrated circuit further comprises: arranging a first logical module within the multiple layer integrated circuit, the first logical module vertically spanning the pair of layers, and the first logical module comprising vertical interconnects at positions permitted by the set of valid vertical interconnect positions; generating a second logical module within said multiple layer integrated circuit, a layout of said second logical module being a result of applying the predetermined transformation to the first logical module with respect to the valid transformation origin and placing the result at a horizontally offset position with respect to the first logical module, wherein applying the horizontal offset to the valid transformation origin results in an offset valid transformation origin at a same relative position with respect to the tessellating sub-region; and outputting the arrangement of said multiple layer integrated circuit.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of generating a set of valid vertical interconnect positions for a multiple layer integrated circuit, wherein said multiple layer integrated circuit comprises:

multiple layers stacked vertically above one another;

a bonding interface between a pair of layers in said multiple layers, wherein said bonding interface is formed by coupling of a pair of conductive bond patterns formed on facing surfaces of said pair of layers, each pattern of said pair of conductive bond patterns comprising an arrangement of conductive bonding elements, said method comprising the steps of:

defining a candidate transformation origin within a horizontal plane defined by said bonding interface;

defining a sub-region within said arrangement of conductive bonding elements, wherein said sub-region tessellates across said arrangement of conductive bonding elements;

applying a predetermined transformation in said horizontal plane with respect to said candidate transformation origin to said arrangement of conductive bonding elements within said sub-region to generate a transformed arrangement of conductive bonding elements;

determining validity of said candidate transformation origin in dependence on coincidence of at least a subset of said arrangement of conductive bonding elements with said transformed arrangement of conductive bonding elements;

selecting a valid transformation origin in dependence on an outcome of said step of determining validity of said candidate transformation origin;

defining said set of valid vertical interconnect positions associated with said valid transformation origin where said arrangement of conductive bonding elements coincides with said transformed arrangement of conductive bonding elements; and outputting said set of valid vertical interconnect positions.

2. The method of claim 1, wherein said multiple layer integrated circuit comprises a second bonding interface between a second pair of layers in said multiple layers, and said second bonding interface is formed by the coupling of a second pair of conductive bond patterns formed on facing surfaces of said second pair of layers, each pattern of said second pair of conductive bond patterns comprising a second arrangement of conductive bonding elements, and the method comprises:

defining said sub-region within a combined pattern formed by overlaying said arrangement of conductive bonding elements on said second arrangement of conductive bonding elements, wherein said sub-region tessellates across said combined pattern;

applying said predetermined transformation in said horizontal plane with respect to said candidate transformation origin to said second arrangement of conductive bonding elements within said sub-region to generate a transformed second arrangement of conductive bonding elements, wherein said step of determining said validity of said candidate transformation origin is performed in further dependence on coincidence of at least a subset of said second arrangement of conductive bonding elements with said transformed second arrangement of conductive bonding elements; and defining a second set of valid vertical interconnect positions associated with said valid transformation origin where said second arrangement of conductive bonding elements coincides with said transformed second arrangement of conductive bonding elements.

3. The method of claim 1, wherein said predetermined transformation comprises a rotational transformation.

4. The method of claim 1, wherein said predetermined transformation comprises a reflectional transformation.

5. The method of claim 1, further comprising:

applying at least one further predetermined transformation in said horizontal plane with respect to said candidate transformation origin to said arrangement of conductive bonding elements to generate at least one further transformed arrangement of conductive bonding elements, wherein said step of determining validity of said candidate transformation origin is performed in further dependence on coincidence of at least a subset of said arrangement of conductive bonding elements with said at least one further transformed arrangement of conductive bonding elements.

6. The method of claim 1, wherein coincidence of one of said arrangement of conductive bonding elements with one of said transformed arrangement of conductive bonding elements is determined to occur if an overlap area between said one of said arrangement of conductive bonding elements with said one of said transformed arrangement of conductive bonding elements allows a legal placement of a vertical interconnect with respect both to said arrangement of conductive bonding elements and to said transformed arrangement of conductive bonding elements.

7. The method of claim 2, wherein said sub-region is determined by a sub-region determination process comprising the steps of identifying a first pair of orthogonal regularity distances at which said arrangement of conductive bonding elements repeats, said first pair of orthogonal regularity distances being defined with respect to axes which are mutually orthogonal;

identifying a second pair of orthogonal regularity distances at which said second arrangement of conductive bonding elements repeats, said second pair of orthogonal regularity distances being defined with respect to said axes; and determining an orthogonal pair of lowest common multiple distances from said first pair of orthogonal regularity distances and said second pair of orthogonal regularity distances, said orthogonal pair of lowest common multiple distances defining said sub-region.

8. The method of claim 7, further comprising:

determining if said sub-region comprises at least one conductive bonding element which repeats at low frequency in said combined pattern; and eliminating said at least one conductive bonding element which repeats at low frequency from said sub-region determination process.

9. The method of claim 7, wherein said predetermined transformation comprises a rotational transformation and wherein said orthogonal pair of lowest common multiple distances are both determined as a single lowest common multiple distance from said first pair of orthogonal regularity distances and said second pair of orthogonal regularity distances.

10. The method of claim 1, wherein said step of defining a candidate transformation origin is performed as an iterative process, wherein a chosen location of said candidate transformation origin is incremented by a predetermined increment for each step of said iterative process.

11. The method of claim 1, wherein said predetermined increment is determined by a minimum manufacturing step size for said multiple layer integrated circuit.

12. The method of claim 1, wherein said bonding interface is a copper bond interface and said conductive bonding elements are copper bond points.

13. The method of claim 2, wherein said arrangement of conductive bonding elements and second arrangement of conductive bonding elements are the same.

14. The method of claim 2, wherein said arrangement of conductive bonding elements and second arrangement of conductive bonding elements are different.

15. The method of claim 1, wherein said arrangement of conductive bonding elements is predetermined in association with said predetermined transformation to enhance coincidence of said arrangement of conductive bonding elements with said transformed arrangement of conductive bonding elements.

16. The method of claim 2, wherein said second arrangement of conductive bonding elements is predetermined in association with said predetermined transformation to enhance coincidence of said second arrangement of conductive bonding elements with said transformed second arrangement of conductive bonding elements.

17. The method of claim 1, wherein said outputting said set of valid vertical interconnect positions for said multiple layer integrated circuit comprises storing said set of valid vertical interconnect positions for said multiple layer integrated circuit in a non-transient fashion on a computer-readable storage medium.

18. The method of claim 1, wherein said outputting said set of valid vertical interconnect positions for said multiple layer integrated circuit comprises manufacturing said multiple layer integrated circuit in accordance with said set.

19. A computer-readable storage medium storing in a non-transient fashion said set of valid vertical interconnect positions for said multiple layer integrated circuit generated in accordance with the method of claim 1.

20. A multiple layer integrated circuit having a set of valid vertical interconnect positions generated in accordance with the method of claim 1.

21. A method of generating an arrangement of a multiple layer integrated circuit, comprising the method as claimed in claim 1 and further comprising the steps of:
   arranging a first logical module within said multiple layer integrated circuit, said first logical module vertically spanning said pair of layers, and said first logical module comprising a plurality of vertical interconnects at positions permitted by said set of valid vertical interconnect positions;
   generating a second logical module within said multiple layer integrated circuit, a layout of said second logical module being a result of applying said predetermined transformation to said first logical module with respect to said valid transformation origin, and placing said result at a horizontal offset with respect to said first logical module, wherein applying said horizontal offset to said valid transformation origin results in an offset valid transformation origin at a same relative position with respect to said tessellating sub-region; and
   outputting said arrangement of said multiple layer integrated circuit.

22. The method of claim 21, wherein said multiple layer integrated circuit comprises a second bonding interface between a second pair of layers in said multiple layers, and said second bonding interface is formed by the coupling of a second pair of conductive bond patterns formed on facing surfaces of said second pair of layers, each pattern of said second pair of conductive bond patterns comprising a second arrangement of conductive bonding elements, and the method further comprising:
   defining said sub-region within a combined pattern formed by overlaying said arrangement of conductive bonding elements on said second arrangement of conductive bonding elements, wherein said sub-region tessellates across said combined pattern;
   applying said predetermined transformation in said horizontal plane with respect to said candidate transformation origin to said second arrangement of conductive bonding elements within said sub-region to generate a transformed second arrangement of conductive bonding elements,
   wherein said step of determining said validity of said candidate transformation origin is performed in further dependence on coincidence of at least a subset of said second arrangement of conductive bonding elements with said transformed second arrangement of conductive bonding elements; and
   defining a second set of valid vertical interconnect positions associated with said valid transformation origin where said second arrangement of conductive bonding elements coincides with said transformed second arrangement of conductive bonding elements,
   wherein said first logical module additionally vertically spans said second pair of layers and comprises a second plurality of vertical interconnects at positions permitted by said second set of valid vertical interconnect positions.

23. The method of claim 21, wherein said outputting said arrangement of said multiple layer integrated circuit comprises storing said arrangement of said multiple layer integrated circuit in a non-transient fashion on a computer-readable storage medium.

24. The method of claim 21, wherein said outputting said arrangement of said multiple layer integrated circuit comprises manufacturing said multiple layer integrated circuit in accordance with said arrangement.

25. A computer-readable storage medium storing in a non-transient fashion said arrangement of said multiple layer integrated circuit generated in accordance with the method of claim 21.

26. A multiple layer integrated circuit having an arrangement generated in accordance with the method of claim 21.

* * * * *